(12) United States Patent
Nakajima et al.

(10) Patent No.: US 9,086,444 B2
(45) Date of Patent: Jul. 21, 2015

(54) MAGNETIC FIELD DETECTION DEVICE AND CURRENT SENSOR

(75) Inventors: Hiroyoshi Nakajima, Tokyo (JP); Takakazu Imai, Tokyo (JP); Takuya Daigo, Tokyo (JP); Reiji Okuno, Tokyo (JP); Junya Fukuda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 202 days.

(21) Appl. No.: 13/519,802

(22) PCT Filed: Dec. 28, 2010

(86) PCT No.: PCT/JP2010/073753
§ 371 (c)(1),
(2), (4) Date: Jun. 28, 2012

(87) PCT Pub. No.: WO2011/081197
PCT Pub. Date: Jul. 7, 2011

(65) Prior Publication Data
US 2012/0293170 A1 Nov. 22, 2012

(30) Foreign Application Priority Data
Dec. 28, 2009 (JP) ................................. 2009-297648

(51) Int. Cl.
*G01R 33/02* (2006.01)
*G01R 33/09* (2006.01)
(Continued)

(52) U.S. Cl.
CPC ............... *G01R 33/093* (2013.01); *B82Y 25/00* (2013.01); *G01R 15/207* (2013.01)

(58) Field of Classification Search
CPC ................................. G01R 33/09; G01R 15/20

USPC ................ 324/252, 126–129, 244, 251, 253, 324/117 H, 117 R, 260–263
See application file for complete search history.

(56) References Cited

U.S. PATENT DOCUMENTS 3,199,026 A * 8/1965 Leibowitz ..................... 324/127
4,011,505 A * 3/1977 Spalding .................... 324/117 R
(Continued)

FOREIGN PATENT DOCUMENTS

JP 06-130088 A 5/1994
JP 3024442 2/1996
(Continued)

*Primary Examiner* — Patrick Assouad
*Assistant Examiner* — Lamarr Brown
(74) *Attorney, Agent, or Firm* — McDermott Will & Emery LLP

(57) ABSTRACT

Provided is a magnetic field detection device and a current sensor capable of increasing the degree of freedom in selecting the type of the magnetic field detection element.
A magnetic field detection device 1 includes a conductor 3 that generates a magnetic field; a C core 2 provided so as to surround the conductor 3; and a magnetic field detection element 4 that detects a magnetic field. The C core 2 has a gap G1, and the magnetic field detection element 4 is disposed at a position where the magnetic field generated from the conductor 3 can be detected, the position being outside the gap G1. Since the direction of the magnetic flux varies outside of the gap G1 from place to place, the direction of the magnetic flux that passes through the magnetic field detection element 4 can be arbitrarily selected by arbitrarily selecting the installation location of the magnetic field detection element 4. Therefore, the degree of freedom in selecting the type of the magnetic field detection element 4 is increased.

17 Claims, 30 Drawing Sheets

(51) Int. Cl.
  *B82Y 25/00* (2011.01)
  *G01R 15/20* (2006.01)

(56) References Cited

U.S. PATENT DOCUMENTS

| | | | |
|---|---|---|---|
| 4,574,222 A * | 3/1986 | Anderson | 315/254 |
| 4,639,665 A * | 1/1987 | Gary | 324/117 H |
| 5,572,385 A * | 11/1996 | Kuwamoto | 360/234.6 |
| 5,739,608 A * | 4/1998 | Kim | 310/90.5 |
| 5,767,667 A * | 6/1998 | Shafie | 324/117 R |
| 6,160,322 A * | 12/2000 | Gotoh et al. | 307/106 |
| 6,411,078 B1 * | 6/2002 | Nakagawa et al. | 324/117 H |
| 6,515,468 B1 * | 2/2003 | Morimoto et al. | 324/117 H |
| 6,636,029 B1 * | 10/2003 | Kunze et al. | 324/117 R |
| 7,663,358 B2 | 2/2010 | Hashio et al. | |
| 7,679,357 B2 * | 3/2010 | Aratani et al. | 324/117 H |
| 8,772,973 B2 * | 7/2014 | Kurs | 307/104 |
| 8,810,235 B2 * | 8/2014 | Ueno et al. | 324/117 H |
| 2001/0043155 A1 * | 11/2001 | Kato | 342/1 |
| 2003/0160601 A1 * | 8/2003 | Lenhard et al. | 324/117 H |
| 2003/0179063 A1 * | 9/2003 | Preusse et al. | 336/182 |
| 2004/0070878 A1 * | 4/2004 | Abe | 360/129 |
| 2004/0095130 A1 * | 5/2004 | Yokotani et al. | 324/207.21 |
| 2004/0113743 A1 * | 6/2004 | Sezai et al. | 336/221 |
| 2005/0007095 A1 * | 1/2005 | Cattaneo et al. | 324/117 R |
| 2006/0006975 A1 * | 1/2006 | Jitaru et al. | 336/212 |
| 2006/0033487 A1 * | 2/2006 | Nagano et al. | 324/117 H |
| 2006/0043960 A1 * | 3/2006 | Itoh et al. | 324/117 R |
| 2006/0066292 A1 * | 3/2006 | Tadatsu | 324/117 H |
| 2006/0158176 A1 * | 7/2006 | Preusse et al. | 324/117 R |
| 2007/0090826 A1 * | 4/2007 | Itoh | 324/117 R |
| 2007/0188946 A1 * | 8/2007 | Shoji | 360/324.12 |
| 2008/0186021 A1 * | 8/2008 | Hashio et al. | 324/225 |
| 2008/0316655 A1 * | 12/2008 | Shoji | 360/324.1 |
| 2009/0009156 A1 * | 1/2009 | Duric | 324/202 |
| 2009/0058404 A1 * | 3/2009 | Kurumado | 324/207.25 |

FOREIGN PATENT DOCUMENTS

| | | | |
|---|---|---|---|
| JP | 3024442 U | | 2/1996 |
| JP | 2000-283999 A | | 10/2000 |
| JP | 2006-017457 | | 1/2006 |
| JP | 2006-017457 A | | 1/2006 |
| JP | 2006032663 | * | 2/2006 |
| JP | 2008-020403 | | 1/2008 |
| JP | 2008-151743 | | 7/2008 |
| JP | 2013096850 | * | 5/2013 |
| WO | WO2004074860 | * | 9/2004 |
| WO | WO2010067649 | * | 6/2010 |

* cited by examiner

MAGNETIC FIELD DETECTION DEVICE AND CURRENT SENSOR

RELATED APPLICATIONS

This application is the U.S. National Phase under 35 U.S.C. §371 of International Application No. PCT/JP2010/073753, filed on Dec. 28, 2010, which in turn claims the benefit of Japanese Application No. 2009-297648, filed on Dec. 28, 2009, the disclosures of which Applications are incorporated by reference herein.

TECHNICAL FIELD

The present invention relates to a magnetic field detection device and a current sensor and, more particularly to a magnetic field detection device and a current sensor that use a magnetic field detection element, such as a GMR element or a Hall element of which magnetic field detection directions are restricted.

BACKGROUND ART

In recent years, a magnetic field detection device has come to be used in various applications such as motors, industrial equipment, and automobiles. The magnetic field detection device is a device that has a magnetic field detection element such as a GMR (Giant Magneto Resistive) element or a Hall element and uses the magnetic field detection element to detect a magnetic field generated from a magnetic field source (such as a current and magnet)). PTL 1 discloses an example of the magnetic field detection device using the Hall element.

In the magnetic field detection device disclosed in PTL 1, a magnetic path is constituted by using a magnetic body called C core so as to concentrate the magnetic field generated from the magnetic field source in the magnetic field detection element.

FIG. 30 is a schematic view illustrating an example of the C core. In FIG. 30, the longitudinal direction of the figure indicates the vertical direction, and the lateral direction and depth direction thereof indicate the horizontal direction. As illustrated, a C core 100 is an annular magnetic body having a gap 101 in the middle thereof, and the name of the "C core" is derived from this shape. The C core 100 is disposed so as to surround a magnetic field source 102 (current, in this example). This configuration allows a magnetic field 103 generated from the magnetic field source 102 to concentrate inside the C core 100 and inside the gap 101 (space 104). The magnetic field detection element is provided in the space 104 in which the magnetic field 103 concentrates. The Hall sensor described in PTL 1 is also provided in the space 104.

CITATION LIST

Patent Literature

[PTL 1] Japanese Patent Application Laid-Open Publication No. 2008-20403

SUMMARY OF THE INVENTION

Problems to be Solved by the Invention

A magnetic flux in the space inside the gap of the C core flows substantially only in one direction (vertical direction, in the example of FIG. 30). That is, the gap of the C core is a space sandwiched between two parallel magnetic pole surfaces, and only the magnetic flux that comes and goes from/to the C core through the magnetic pole surfaces appears in the space inside the gap. In addition, the direction of the magnetic flux that flows between the two parallel magnetic pole surfaces is substantially perpendicular to the magnetic pole surfaces. Therefore, the direction of the magnetic flux in the space inside the gap is substantially limited to the direction perpendicular to the magnetic pole surfaces.

In general, an installation direction of the magnetic field detection element is determined by a factor such as a circuit configuration unrelated to the magnetic flux direction. For example, the GMR element is generally installed in such a way that a magnetic field detection direction (=magnetization direction (PIN direction) of a ferromagnetic fixed layer (PIN layer)) is parallel to the horizontal direction, and the Hall element is generally installed in such a way that a magnetic field detection direction (=normal direction of a semiconductor thin film constituting the Hall element) is parallel to the vertical direction. As far as conforming to such an installation direction, only the Hall element can be installed in the gap of the C core illustrated in FIG. 30. On the other hand, in a C core having a gap in, e.g., an upper side portion thereof, only the GMR element can be installed. Thus, a conventional magnetic field detection device has a problem of a low degree of freedom in selecting the type of the magnetic field detection element.

An object of the present invention is therefore to provide a magnetic field detection device and a current sensor capable of increasing the degree of freedom in selecting the type of the magnetic field detection element.

Means for Solving the Problems

A magnetic field detection device according to the present invention for achieving the above object comprises: a first magnetic field source that generates a magnetic field; a first magnetic body provided so as to surround the first magnetic field source; and a magnetic field detection element that detects a magnetic field, wherein a first gap is formed in the first magnetic body, and the magnetic field detection element is disposed at a position where a magnetic field generated from the first magnetic field source can be detected, the position being outside the first gap.

Since the direction of the magnetic flux varies outside of the first gap G1 from place to place, the direction of the magnetic flux that passes through the magnetic field detection element can be arbitrarily selected by arbitrarily selecting the installation location of the magnetic field detection element. Therefore, the degree of freedom in selecting the type of the magnetic field detection element is increased.

In the above-mentioned magnetic field detection device, the first gap may be constituted by two parallel first and second magnetic pole surfaces, and the magnetic field detection element may be disposed so as to be able to detect the magnetic flux going in and out of the first magnetic body through side surfaces in the vicinity of the first gap which are surfaces different from the first and second magnetic pole surfaces.

In this magnetic field detection device, the first magnetic body may include a first end portion extending in a perpendicular direction to the first magnetic pole surface serving as an end surface of the first end portion, and the magnetic field detection element may be disposed at a lateral side of the first end portion. According to this configuration, the magnetic field detection element can detect a magnetic flux going in and out of the first magnetic body through the side surface of the first end portion.

Further, the first magnetic body may include: a second end portion having the second magnetic pole surface; and an extension portion extending perpendicular to a gap direction of the first gap from the second end portion. According to this configuration, an amount of the magnetic flux going in and out of the first magnetic body through the side surface of the first end portion is increased, so that the sensitivity of the magnetic field detection element can be enhanced.

In each of the above-mentioned magnetic field detection devices, at least apart of the magnetic field source may be disposed in the first gap. According to this configuration, a distribution of the magnetic flux going in and out of the first magnetic body through the side surface in the vicinity of the first gap becomes wider, so that a larger installation space can be ensured for the magnetic field detection element.

In each of the above-mentioned magnetic field detection devices, the magnetic field detection device may further comprises second magnetic field source that generates a magnetic field; and a second magnetic body provided so as to surround the second magnetic field source, wherein a second gap may be formed in the second magnetic body, and the magnetic field detection element may be disposed at a position where a magnetic field generated from the second magnetic field source can be detected, the position being outside the second gap. According to this configuration, the magnetic field detection element can satisfactorily detect both the magnetic fields generated from the first and second magnetic field sources.

In each of the above-mentioned magnetic field detection devices, the second gap may be constituted by two parallel third and fourth magnetic pole surfaces, and the magnetic field detection element may be disposed so as to be able to detect also the magnetic flux going in and out of the second magnetic body through side surfaces in the vicinity of the second gap which are surfaces different from the third and fourth magnetic pole surfaces.

A magnetic field detection device according to another aspect of the present invention comprises: a magnetic field detection element that detects a magnetic field; a first magnetic body core provided so as to surround the magnetic field detection element from four directions in a horizontal plane; a second magnetic body core provided so as to surround the first magnetic body core from four direction in a first plane perpendicular to the horizontal surface; and a first magnetic field source provided between a lower surface of the first magnetic body core and a lower side inner wall surface of the second magnetic body core, wherein an upper surface of the first magnetic body core and an upper side inner wall surface of the second magnetic body core may magnetically contact each other, and the lower surface of the first magnetic body core and the lower side inner wall surface of the second magnetic body core may be isolated from each other.

According to the present invention, a magnetic path is constituted by the first and second magnetic body cores, and a gap is formed with the lower surface of the first magnetic body core and the lower side inner wall surface of the second magnetic body core being as the magnetic pole surface. Thus, the first magnetic body is realized by the first and second magnetic body cores, increasing the degree of freedom in selecting the type of the magnetic field detection element. Further, an external magnetic field is shielded by the first and second magnetic body cores, allowing an increase in resistance against the external magnetic field.

In the above-mentioned magnetic field detection device, the magnetic field detection device may further comprise a second magnetic field source provided between the lower surface of the first magnetic body core and the lower side inner wall surface of the second magnetic body core, wherein the first and second magnetic field sources may be disposed on opposite sides in the first plane with respect to the magnetic field detection element. According to this configuration, the magnetic field detection element can satisfactorily detect both the magnetic fields generated from the first and second magnetic field sources.

In the above-mentioned magnetic field detection device, the magnetic field detection element may have a pair of magnetoresistive elements which are provided on opposite sides with respect to a center line of the first and second magnetic field sources perpendicular to the first plane and which have the same PIN direction. According to this configuration, by connecting the pair of magnetoresistive elements in series between a power supply voltage and a ground voltage and acquiring a voltage between them, a magnetic field can be detected. The PIN direction of the pair of magnetoresistive elements may be different from an extending direction of the center line or may be perpendicular to the center line. Further, the pair of magnetoresistive elements have the same free direction, and the magnetic field detection device may further include a third magnetic field source that generates a magnetic field parallel to the free direction.

In each of the above-mentioned magnetic field detection devices, the first and second magnetic field sources may be each a linear conductor that generates a magnetic field when a current flows therethrough, and an extending direction of each of the first and second magnetic field sources may be perpendicular to the first plane.

In each of the above-mentioned magnetic field detection devices, each of the first and second magnetic body cores may constitute a line-symmetrical closed curve. Further, a normal vector of the closed curve constituted by the first magnetic body core and a normal vector of the closed curve constituted by the second magnetic body core may be perpendicular to each other.

In each of the above-mentioned magnetic field detection devices, at least a part of the lower surface of the first magnetic body core may be positioned above a lower surface of the magnetic field detection element. According to this configuration, the sensitivity of the magnetic field detection element can be controlled.

A current sensor according to the present invention is one of the above-mentioned magnetic field detection devices, and the first magnetic field source is a conductor through which a current flows.

Advantageous Effects of the Invention

According to the present invention, the degree of freedom in selecting the type of the magnetic field detection element can be increased.

MODE FOR CARRYING OUT THE INVENTION

Preferred embodiments of the present invention will be described in detail hereinafter with reference to the accompanying drawings.

Figure 1:
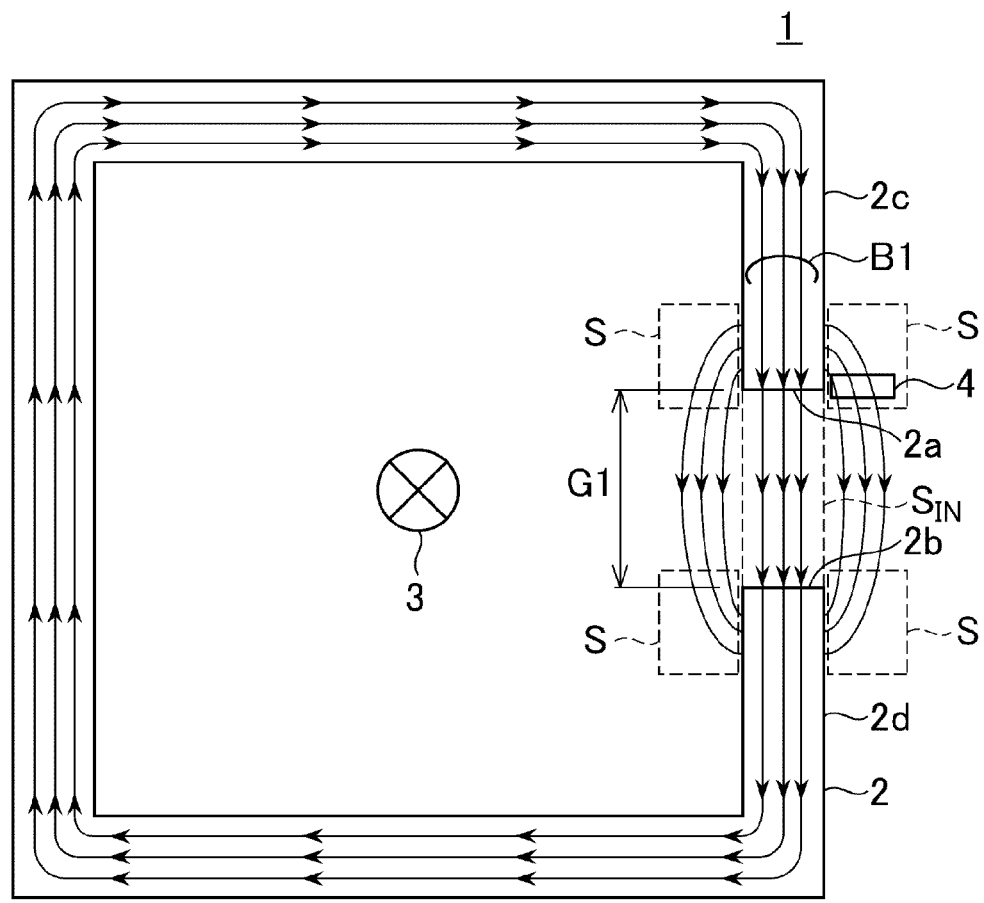
FIG. 1 is a schematic view illustrating a configuration of a magnetic field detection device according to a first embodiment of the present invention.
Figure 1:
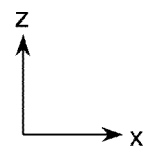

FIG. 1 is a schematic view illustrating a configuration of a magnetic field detection device 1 according to a first embodiment of the present invention. As illustrated, the magnetic field detection device 1 includes a C core 2 (first magnetic body) which is an annular magnetic body, a conductor 3 (first magnetic field source) extending in the direction toward the far side of the figure, and a magnetic field detection element 4. For specifying directions, x-, y-, and z-axes are given to FIG. 1 and subsequent figures.

The conductor 3 is designed to allow a current to flow therethrough. Making the current flow through the conductor 3 allows the conductor 3 to function as a magnetic field source that generates an illustrated magnetic field B1. In the example of FIG. 1, the current flows from the near side of the figure toward the far side thereof, so that the magnetic field B1 rotates clockwise.

The C core 2 is provided so as to surround a cross section of the conductor 3 and functions as a magnetic path of the magnetic field B1. The C core 2 is not completely annular but has a gap G1 (first gap) in the middle thereof. The gap G1 includes two parallel magnetic pole surfaces 2a and 2b, and a magnetic flux in a space $S_{IN}$ inside the gap G1 flows substantially only in z-direction as illustrated in FIG. 1. On the other hand, the magnetic flux flows in various directions from place to place in a space outside the gap G1, that is, a space other than a space occupied by C core 2 and space $S_{IN}$.

The C core 2 has end portions 2c and 2d (first and second end portions) extending in the perpendicular direction (z-direction) to the magnetic pole surfaces 2a and 2b (first and second magnetic pole surfaces) constituting the gap G1 and serving as end surfaces of the respective end portions 2c and 2d. The direction of the magnetic flux in the vicinity of the side surfaces of the end portions 2c and 2d-direction of the magnetic flux going in and out of the C core 2 through the end portions 2c and 2d—is, as illustrated in FIG. 1, substantially parallel to a direction (x-direction) perpendicular to the side surfaces of the end portions 2c and 2d.

The magnetic field detection element 4 is a GMR element or a Hall element in the present embodiment. The magnetic field detection element 4 is disposed at a portion where the magnetic field B1 can be detected, the portion being outside the gap G1. In other words, the magnetic field detection element 4 is disposed so as to be able to detect the magnetic flux going in and out of the C core 2 through the side surfaces (side surfaces of the end portions 2c and 2d) in the vicinity of the gap G1 which are surfaces different from the magnetic pole surfaces 2a and 2b.

As illustrated in FIG. 1, the direction of the magnetic flux varies from place to place outside the gap G1. Therefore, in the magnetic field detection device 1, arbitrarily selecting a specific installation position of the magnetic field detection element 4 allows arbitrary selection of the direction of the magnetic flux passing through the magnetic field detection element 4. For example, when the magnetic field detection element 4 is installed at a lateral side (inside an illustrated space S) of the end portion 2c or 2d, the magnetic field detection element 4 can be disposed in such a manner the magnetic flux containing a high proportion of a horizontal direction (x-direction) component passes the magnetic field detection element 4. Thus, the GMR element can be used as the magnetic field detection element 4 of the magnetic field detection device 1 that uses the C core 2 according to a regular installation direction (direction in which the magnetic field detection direction, i.e., PIN direction is parallel to a horizontal direction). Further, the magnetic flux in the space S contains a high proportion of a vertical direction (z-direction) component, so that even the Hall element can be used as the magnetic field detection element 4 of the magnetic field detection device 1 that uses the C core 2 according to a regular installation direction (direction in which the magnetic field detection direction, i.e., a normal direction of a semiconductor thin film constituting the Hall element is parallel to a vertical direction). In the present embodiment, another gap may be formed in the C core 2 in addition to the gap G1 for the purpose of controlling the magnetic field to be generated from the conductor 3.

Figure 2:
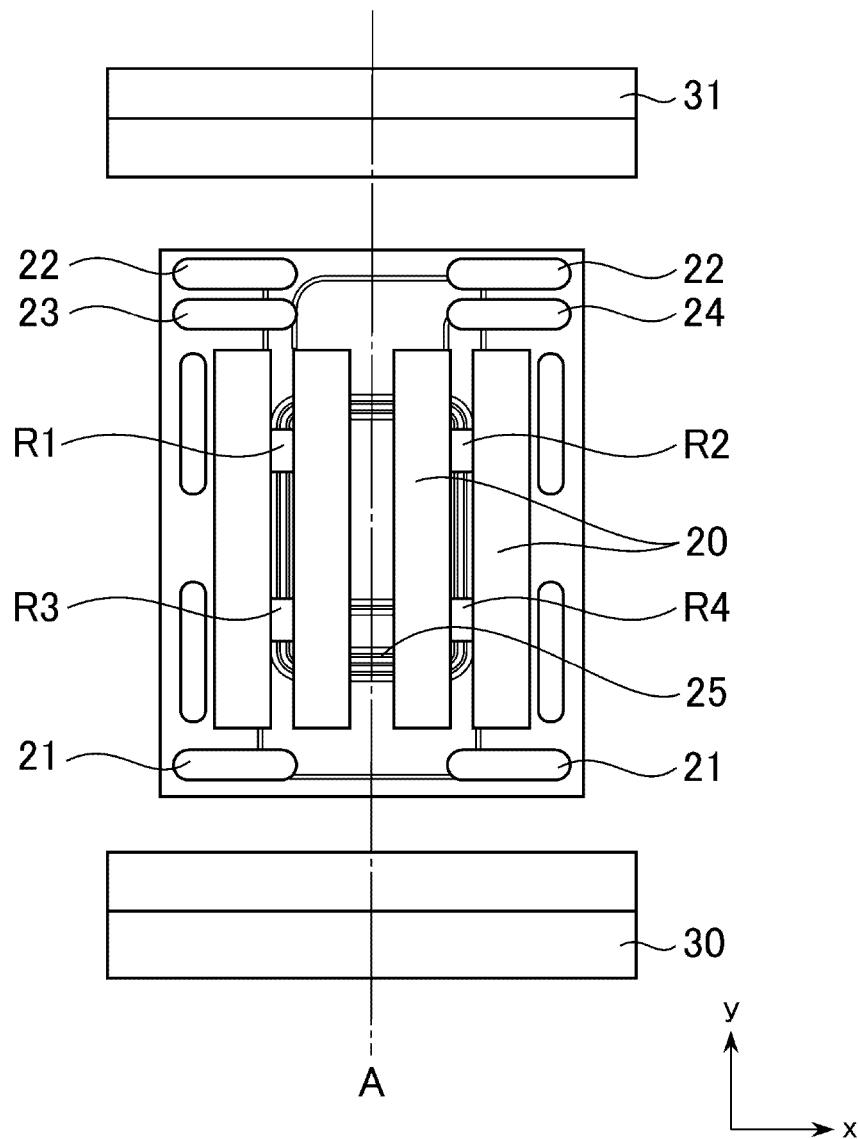
FIG. 2 is a view illustrating a specific configuration example to be adopted when the GMR element is used as the magnetic field detection element according to the first embodiment of the present invention.
Figure 3:
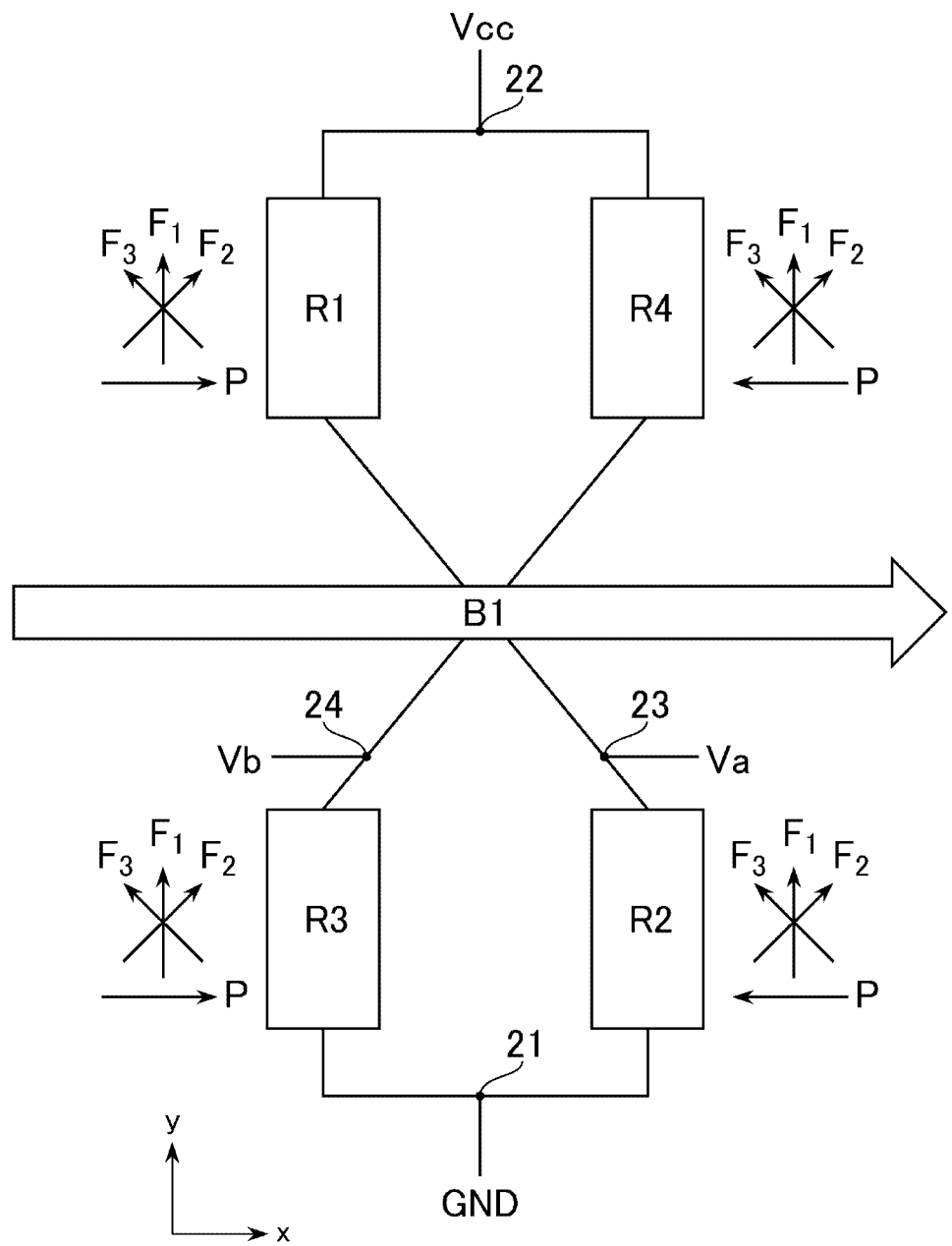
FIG. 3 is a circuit diagram illustrating a connection state of four GMR elements according to the first embodiment of the present invention and the PIN directions and free directions thereof.

FIG. 2 is a view illustrating a specific configuration example to be adopted when the GMR element is used as the magnetic field detection element 4. FIG. 3 is a circuit diagram illustrating a connection state of GMR elements R1 to R4 illustrated in FIG. 2 and the PIN directions and free directions thereof. The magnetic field detection element 4 in this example includes a pair of GMR elements R1 and R2 and another pair of GMR elements R3 and R4. The pair of GMR elements R1 and R2 and pair of GMR elements R3 and R4 are each disposed line-symmetrically with respect to line A extending in y-direction. In other words, the GMR elements R1 and R2 are disposed at positions opposite to each other across line A, and the same applies to the GMR elements R3 and R4. Distances between line A and the respective GMR elements R1 to R4 are equal to each other. The GMR elements R1 and R3 are disposed on the same side.

The PIN directions of the GMR elements R2 and R4 are parallel to x-direction and directed to the C core 2. On the other hand, the PIN directions of the GMR elements R1 and R3 are opposite to the PIN directions of the GMR elements R2 and R4. In FIG. 3, the PIN directions of the respective elements are indicated by arrows P. A pair of magnets 30 and 31 (third magnetic field source) are disposed in y-direction both ends of the magnetic field detection element 4. The free directions of the GMR elements R1 to R4 are determined by the pair of magnets 30 and 31 so as to be directed to the same direction (y-direction) in the absence of magnetic fields B1 and B2. That is, the free directions of the GMR elements R1 to R4 are perpendicular to the PIN directions thereof, respectively. In FIG. 3, the free directions of the respective elements in the absence of the magnetic fields B1 and B2 are indicated by arrows $F_1$.

As illustrated in FIG. 2, the magnetic field detection element 4 further includes permalloy yokes 20 provided on x-direction both sides of the respective GMR elements R1 to R4, terminal electrodes 21 to 24 connected respectively to the GMR elements R1 to R4, and a planar spiral coil 25 for formation of a closed loop that is provided below the GMR elements R1 to R4.

As illustrated in FIG. 3, the GMR elements R1 to R4 constitute a full-bridge circuit. More specifically, the GMR elements R1 and R2 are connected in series between the terminal electrodes 22 and 21. Similarly, the GMR elements R4 and R3 are connected in series between the terminal electrodes 22 and 21. A power supply voltage Vcc is supplied to the terminal electrode 22, and the terminal electrode 21 is grounded. A connection point between the GMR elements R1 and R2 is connected to the terminal electrode 23, and a connection point between the GMR elements R3 and R4 is connected to the terminal electrode 24.

As outputs of the magnetic field detection element 4, a voltage Va appearing at the terminal electrode 23 and a voltage Vb appearing at the terminal electrode 24 are used. The following describes a relationship between the voltage Va, Vb and the magnetic fields B1, B2.

When a current flows through the conductor 3, the magnetic field B1 illustrated in FIG. 1 is generated. As illustrated in FIG. 3, the magnetic field B1 is applied, as a magnetic field parallel to x-direction, to each of the GMR elements R1 to R4.

The application of the magnetic field changes the free direction of each of the GMR elements R1 to R4 to $F_2$ or $F_3$ direction illustrated in FIG. 3.

In a case where the free direction of each of the GMR elements R1 to R4 has changed to $F_2$ direction, resistance values of the GMR elements R1 and R3 are reduced, while resistance value of the GMR elements R2 and R4 are increased. Accordingly, the voltage Va is increased, while the voltage Vb is reduced. In a case where the free direction of each of the GMR elements R1 to R4 has changed to $F_3$ direction, the resistance values of the GMR elements R1 and R3 are increased, while the resistance value of the GMR elements R2 and R4 are reduced. Accordingly, the voltage Va is reduced, while the voltage Vb is increased. Therefore, in both cases, measuring a difference Va-Vb between the voltages Va and Vb allows confirmation of an application of the magnetic field. Further, confirming the sign of the difference Va-Vb allows detection of the direction of the magnetic field, thereby detecting the direction of the current flowing through the conductor 3.

As described above, according to the magnetic field detection device 1 of the present embodiment, both the GMR element and Hall element whose magnetic field detection directions in their regular installation states differ from each other by 90° can be used as the magnetic field detection element 4. That is, a degree of freedom in selecting the type of the magnetic field detection element can be increased.

As the magnetic field detection element 4 installed in the space S of the magnetic field detection device 1 according to the present embodiment, it is preferable to use the GMR element rather than the Hall element. This is because a magnetic flux component in the horizontal direction (x-direction) is minute in the space S, so that the use of the GMR element that detects the magnetic flux in the horizontal direction (x-direction) as the magnetic field detection element 4 allows detection of the magnetic field without saturating the magnetic field detection element 4.

Figure 4:
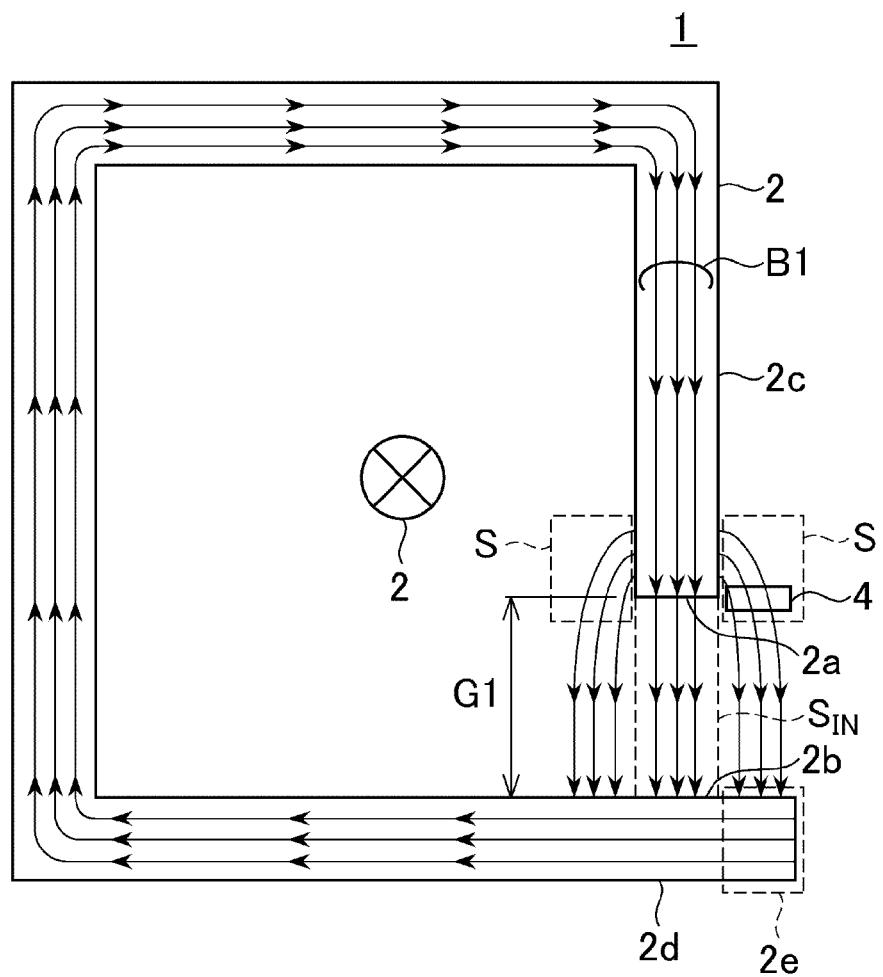
FIG. 4 is a schematic view illustrating a configuration of the magnetic field detection device according to a second embodiment of the present invention.

FIG. 4 is a schematic view illustrating a configuration of the magnetic field detection device 1 according to a second embodiment of the present invention. The magnetic field detection device 1 according to the present embodiment differs from the magnetic field detection device 1 of the first embodiment in the shape of the C core 2.

More specifically, in the C core 2, the end portion 2d is not extended in a direction perpendicular to the magnetic pole surface 2b which is one of the magnetic pole surfaces constituting the gap G1. On the other hand, the C core 2 has an extension portion 2e extending perpendicular to a gap direction (normal direction of the magnetic pole surfaces 2a and 2b, i.e., z-direction) of the gap G1 from the end portion 2d.

According to the configuration of the C core 2 according to the present embodiment, the presence of the extension portion 2e makes a distance between the side surface of the end portion 2c and end portion 2d smaller than in the first embodiment. This increases an amount of the magnetic flux that goes in and out of the C core 2 through the side surface of the end portion 2c, thereby enhancing sensitivity when the magnetic field detection element 4 is installed in the space S. Also in the present embodiment, another gap may be formed in the C core 2 in addition to the gap G1 for the purpose of controlling the magnetic field to be generated from the conductor 3.

Figure 5:
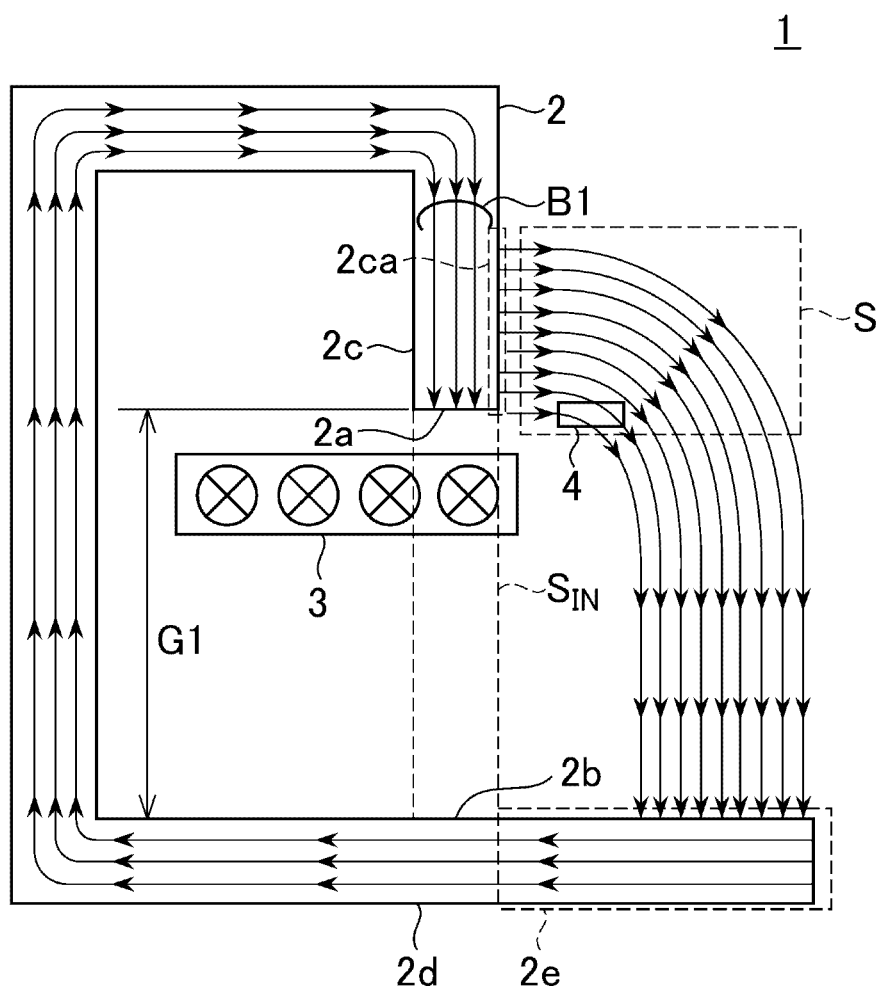
FIG. 5 is a schematic view illustrating a configuration of the magnetic field detection device according to a third embodiment of the present invention.

FIG. 5 is a schematic view illustrating a configuration of the magnetic field detection device 1 according to a third embodiment of the present invention. The magnetic field detection device 1 according to the present embodiment differs from the magnetic field detection device 1 of the second embodiment in the shape of the C core 2 and the position and shape of the conductor 3.

More specifically, in the C core 2, lengths of the gap G1 and extension portion 2e are increased. The conductor 3 is a plate conductor, and a part thereof is located inside the elongated gap G1.

According to the configuration of the C core 2 of the present embodiment, the presence of the conductor 3 in the gap G1 prevents the magnetic flux from passing through the gap G1, which accordingly widens distribution of the magnetic flux going in and out of the C core 2 through an outside side surface 2ca of the end portion 2c, as illustrated in FIG. 5. Thus, as illustrated in FIG. 5, an area of the space S which is suitable as the installation location of the magnetic field detection element 4 is increased, thereby creating a larger space for the installation of the magnetic field detection element 4. Also in the present embodiment, another gap may be formed in the C core 2 in addition to the gap G1 for the purpose of controlling the magnetic field to be generated from the conductor 3.

Figure 6:
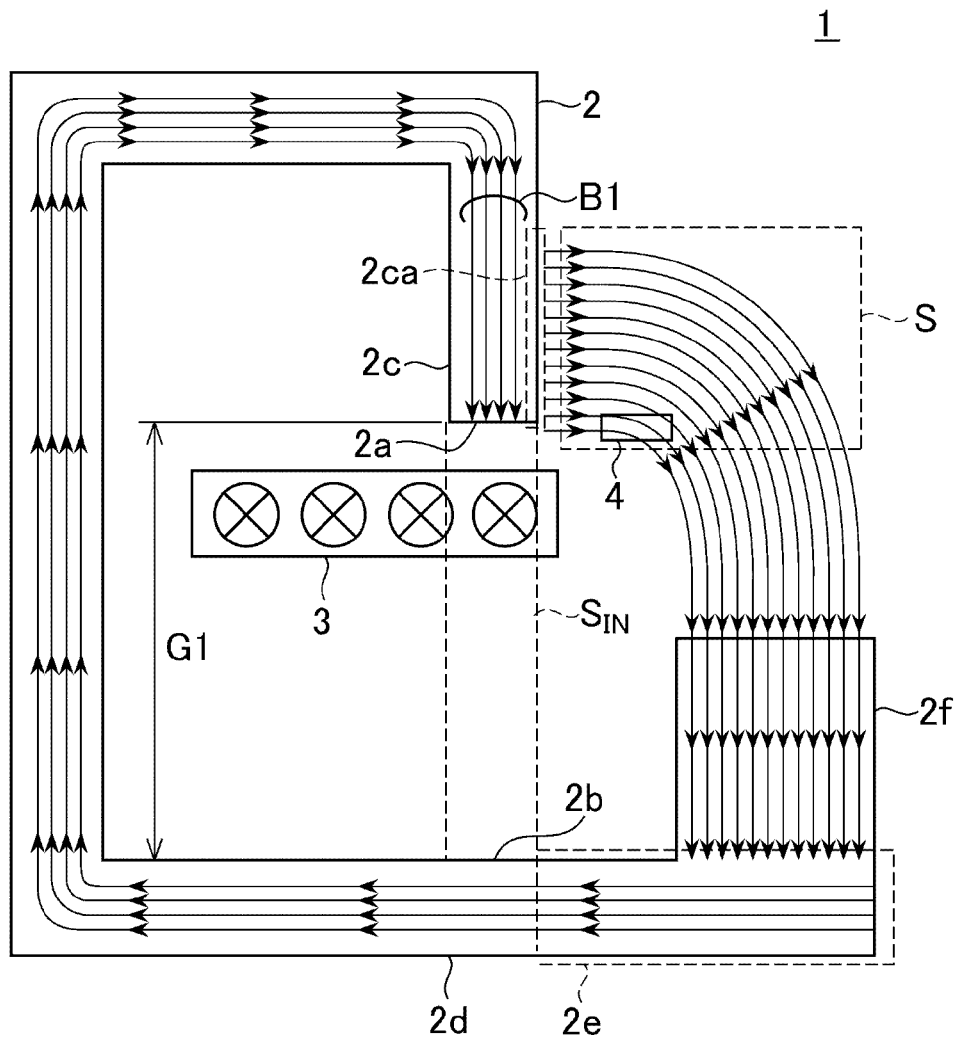
FIG. 6 is a schematic view illustrating a configuration of the magnetic field detection device 1 according to a fourth embodiment of the present invention.
Figure 6:
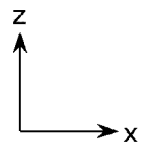

FIG. 6 is a schematic view illustrating a configuration of the magnetic field detection device 1 according to a fourth embodiment of the present invention. The magnetic field detection device 1 according to the present embodiment differs from the magnetic field detection device 1 of the third embodiment in the shape of the C core 2.

More specifically, the C core 2 according to the present embodiment has a projection portion 2f projecting toward the magnetic field detection element 4 side (toward the space S) from a leading end of the extension portion 2e. An upper surface of the projection portion 2f is parallel to the magnetic pole surface 2b.

According to the configuration of the C core 2 of the present embodiment, the magnetic flux going out of the outside side surface 2ca of the end portion 2c converges onto the upper surface of the projection portion 2f, and the flow of the magnetic flux toward the extension portion 2e is created by the projection portion 2f. As a result, as can be seen from a comparison between FIGS. 6 and 5, both the amount of the magnetic flux passing inside the C core 2 and the amount of the magnetic flux passing inside the space S become large in the magnetic field detection device 1 according to the present embodiment than in the magnetic field detection device 1 according to the third embodiment. Accordingly, the amount of the magnetic flux passing through the magnetic field detection element 4 is increased to thereby enhance the magnetic field detection sensitivity of the magnetic field detection element 4. In another respect, the magnetic field detection sensitivity of the magnetic field detection element 4 can be controlled depending on presence/absence of the projection portion 2f.

Figure 7:
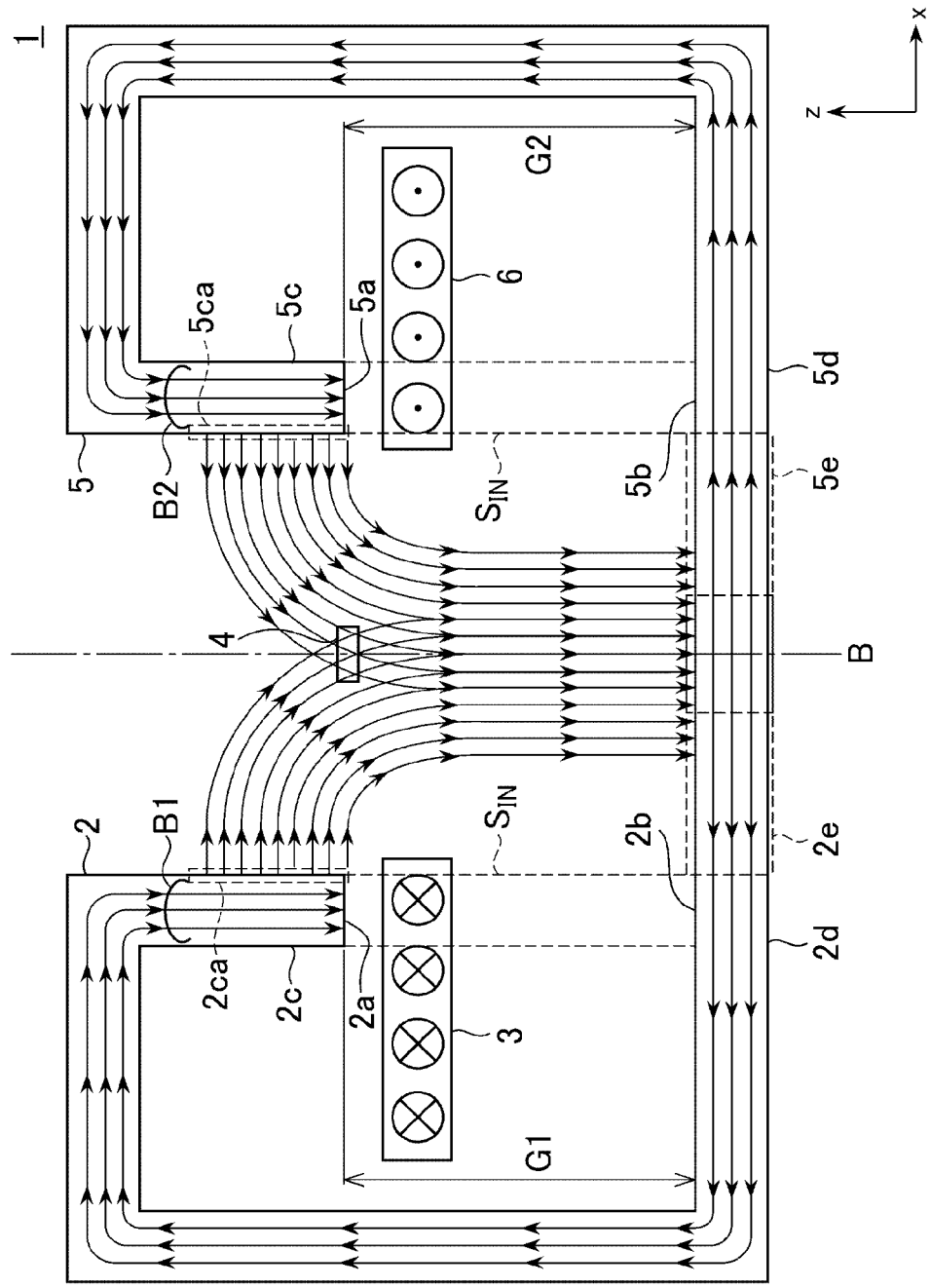
FIG. 7 is a schematic view illustrating a configuration of the magnetic field detection device according to a fifth embodiment of the present invention.

FIG. 7 is a schematic view illustrating a configuration of the magnetic field detection device 1 according to a fifth embodiment of the present invention. The magnetic field detection device 1 according to the present embodiment has a configuration obtained by combining two magnetic field detection devices 1 according to the third embodiment.

As illustrated in FIG. 7, the magnetic field detection device 1 according to the present embodiment includes the magnetic field detection device 1 according to the third embodiment, and further includes a C core 5 (second magnetic body) which is an annular magnetic body and a conductor 6 (second magnetic field source) extending in the direction toward the far side of the figure.

Like the C core 2, the C core 5 has a gap G2 (second gap) including two parallel magnetic pole surfaces 5a and 5b. The C core 5 further has an end portion 5c extending in the perpendicular direction to the magnetic pole surface 5a constituting the gap G2 and serving as an end surface of the end portion 5c, an end portion 5d having a magnetic pole surface 5b, and an extension portion 5e extending perpendicular to a gap direction (normal direction of the magnetic pole surfaces 5a and 5b, i.e., z-direction) of the gap G2 from the end portion 5d. The C core 5 and the C core 2 are plane-symmetrical with respect to y-z plane including line B. The extension portion 5e is formed integrally with the extension portion 2e.

Although the conductor 6 is also a plate conductor like the conductor 3, a current flow direction therein is opposed (direction from the far side to near side, in the example of FIG. 7) to the current flow direction in the conductor 3. Accordingly, the magnetic flux direction of a magnetic field B2 generated from the conductor 6 as the magnetic field source is also opposite (counterclockwise in the example of FIG. 7) to that of the magnetic field B1.

Either the GMR element or Hall element can be used as the magnetic field detection element 4. In a case where the GMR element is used, the GMR element is disposed not on line B, but at a position slightly displaced from line B in x-direction. This is because an x-direction component is balanced between the magnet fields B1 and B2 on the line B to eliminate the x-direction component.

Figure 8:
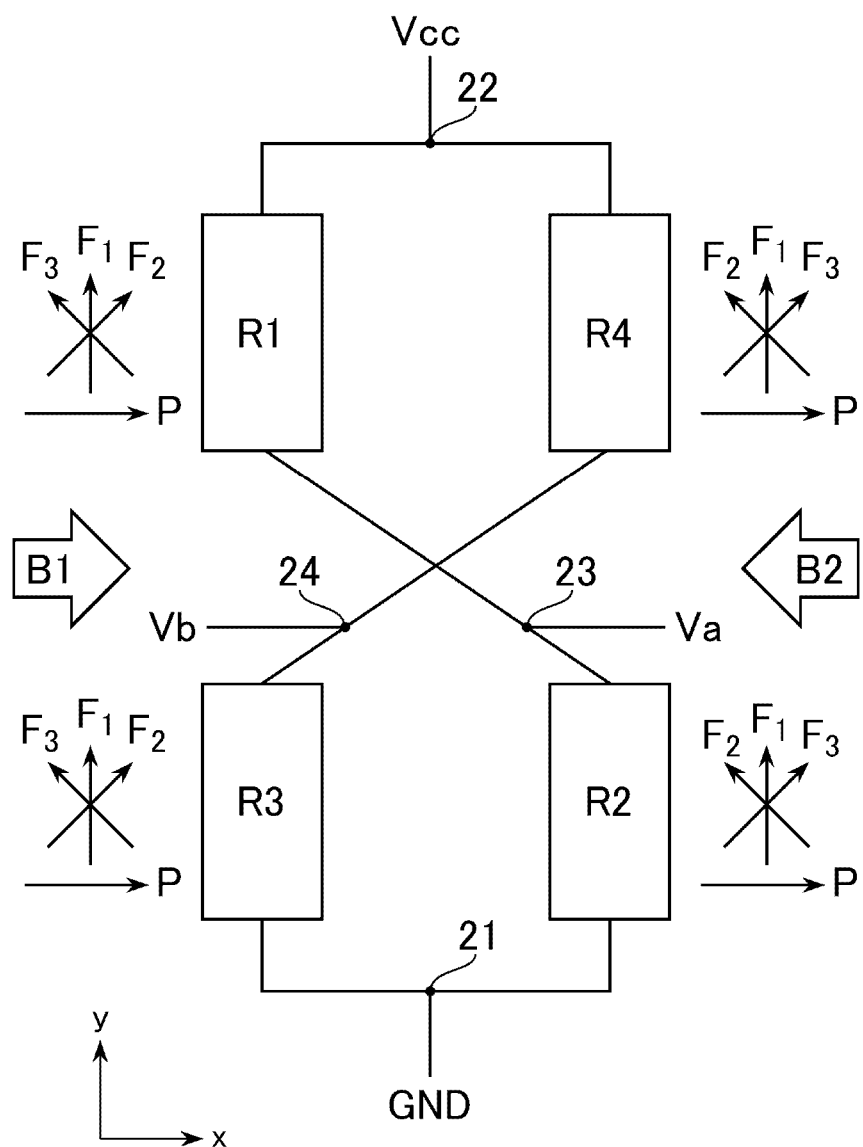
FIG. 8 is a circuit diagram illustrating a connection state of four GMR elements according to the fifth embodiment of the present invention and the PIN directions and free directions thereof.

The case where the GMR element is used as the magnetic field detection element 4 will be described using a more specific configuration example. The specific configuration of the GMR element in this example is the same as the configuration illustrated in FIG. 2. However, it is assumed that line A of FIG. 2 is located on the y-z plane like line B of FIG. 7. FIG. 8 is a circuit diagram illustrating a connection state of the GMR elements R1 to R4 in this example and the PIN directions and free directions thereof. As illustrated in FIG. 3, a connection relationship between the GMR elements R1 and R2 is the same as that in the example of FIG. 3, but the PIN directions of the GMR elements R2 and R4 differ from those in the example of FIG. 3. More specifically, the PIN directions of all the GMR elements R1 to R4 are the same.

When a current flows through the conductors 3 and 6, the magnetic fields B1 and B2 illustrated in FIG. 7 are generated. As illustrated in FIG. 8, due to the magnetic fields B1 and B2, the direction of the magnetic field applied to the GMR elements R1 and R3 and the direction of the magnetic field applied to the GMR elements R2 and R4 are opposite to each other. The application of the magnetic fields changes the free direction of each of the GMR elements R1 to R4 to $F_2$ or $F_3$ direction illustrated in FIG. 8. As is clear from FIG. 8, an opposite change to that observed in the example of FIG. 3 occurs in the GMR elements R2 and R4.

In a case where the free direction of each of the GMR elements R1 to R4 has changed to $F_2$ direction, the resistance values of the GMR elements R1 and R3 are reduced, while the resistance value of the GMR elements R2 and R4 are increased. Accordingly, the voltage Va is increased, while the voltage Vb is reduced. In a case where the free direction of each of the GMR elements R1 to R4 has changed to $F_3$ direction, the resistance values of the GMR elements R1 and R3 are increased, while the resistance value of the GMR elements R2 and R4 are reduced. Accordingly, the voltage Va is reduced, while the voltage Vb is increased. Therefore, in both cases, measuring a difference Va-Vb between the voltages Va and Vb allows confirmation of an application of the magnetic field. Further, confirming the sign of the difference Va-Vb allows detection of the direction of the magnetic field, thereby detecting the direction of the current flowing through the conductors 3 and 6.

With the above configuration, the outside side surface 2ca of the end portion 2c and an outside side surface 5ca of the end portion 5c face each other, and the magnetic flux going out of the C core 2 through the outside side surface 2ca and outside side surface 5ca gathers together around line B and enters the integrally formed extension portions 2e and 5e. Thus, as illustrated in FIG. 7, by disposing the magnetic field detection element 4 in a region between the outside side surface 2ca and outside side surface 5ca, especially, in a region between the outside side surfaces 2ca and 5ca around line B, the magnetic field detection element 4 can satisfactorily detect both the magnetic fields B1 and B2.

Further, in the case where the GMR elements R1 to R4 are used as the magnetic field detection element 4, influence of a uniform external magnetic field such as geomagnetism can be advantageously eliminated since the PIN directions of all the GMR elements R1 to R4 are the same.

Further, the C core 2 and the C core 5 have plane-symmetrical shapes with respect to y-z plane including line B, the pair of GMR elements R1 and R2 and pair of GMR elements R3 and R4 are each disposed line-symmetrically with respect to line A extending in y-direction, and the GMR elements R1 to R4 constitute a full-bridge circuit. With the above configuration, the voltages Va and Vb can be stabilized.

As a specific circuit configuration of the magnetic field detection element 4, not only the full-bridge circuit of FIG. 3 constituted by the four GMR elements, but also a half-bridge circuit constituted by two GMR elements may be adopted.

Figure 9A:
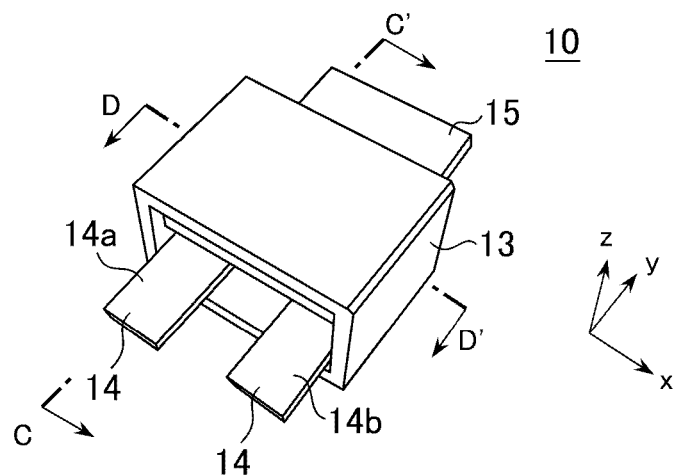
FIG. 9A is a perspective view of a magnetic field detection device according to a sixth embodiment of the present invention.
Figure 9B:
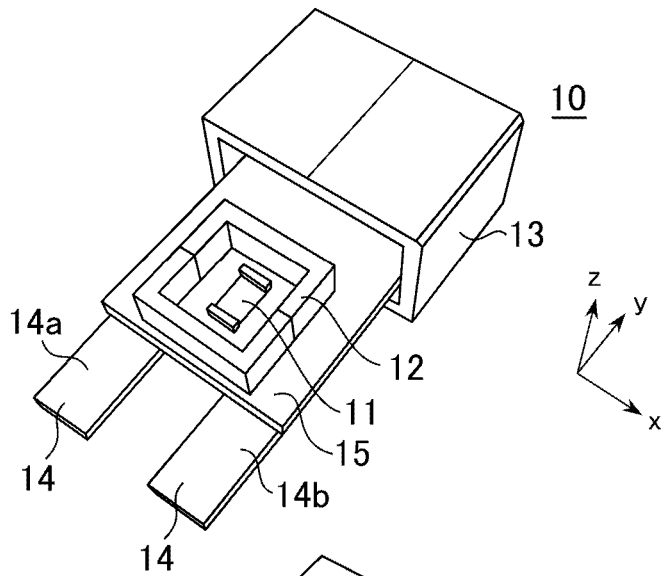
FIG. 9B is a view in which a second magnetic body core of FIG. 9A is slightly displaced so as to show an inner structure of the magnetic field detection device.
Figure 9C:
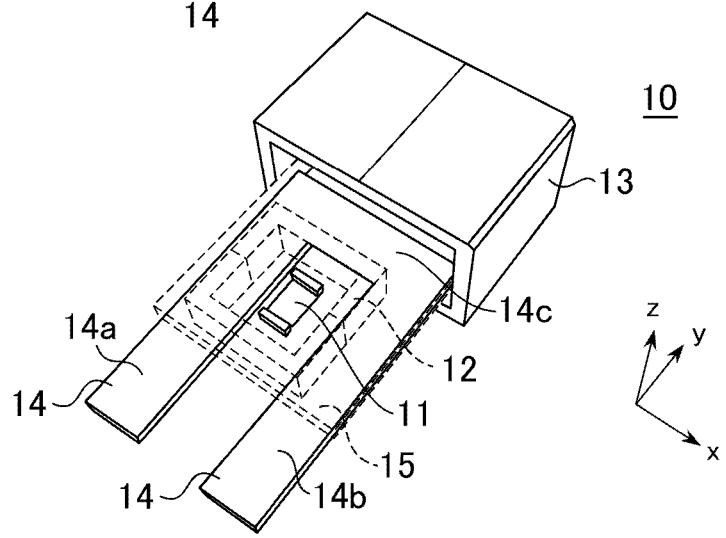
FIG. 9C is a view transparently illustrating a first magnetic core and a substrate of FIG. 9B so as to show a structure of a conductor as a magnetic field source.
Figure 10:
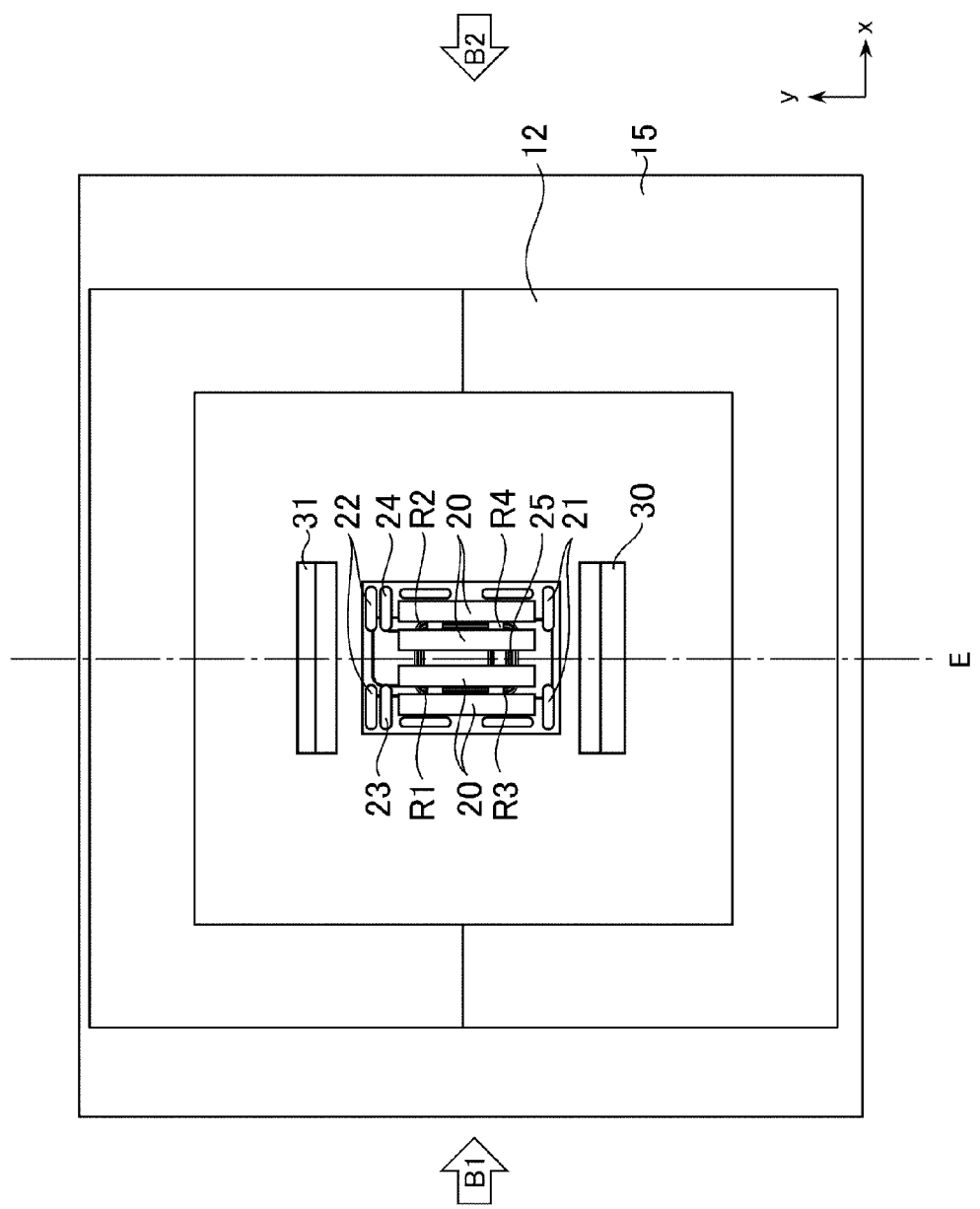
FIG. 10 is a top view of the substrate according to the sixth embodiment of the present invention.
Figure 11A:
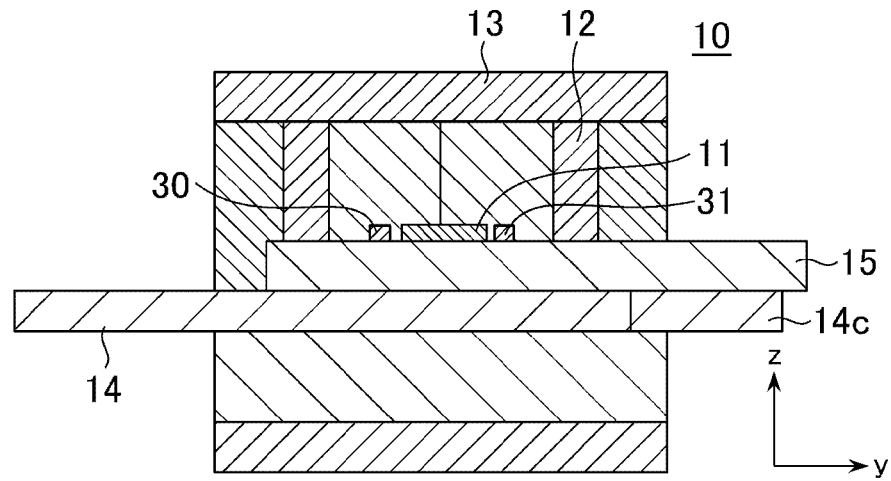
FIGS. 11A and 11B are cross-sectional views taken along line C-C' and line D-D' as shown in FIG. 9A, respectively.
Figure 11B:
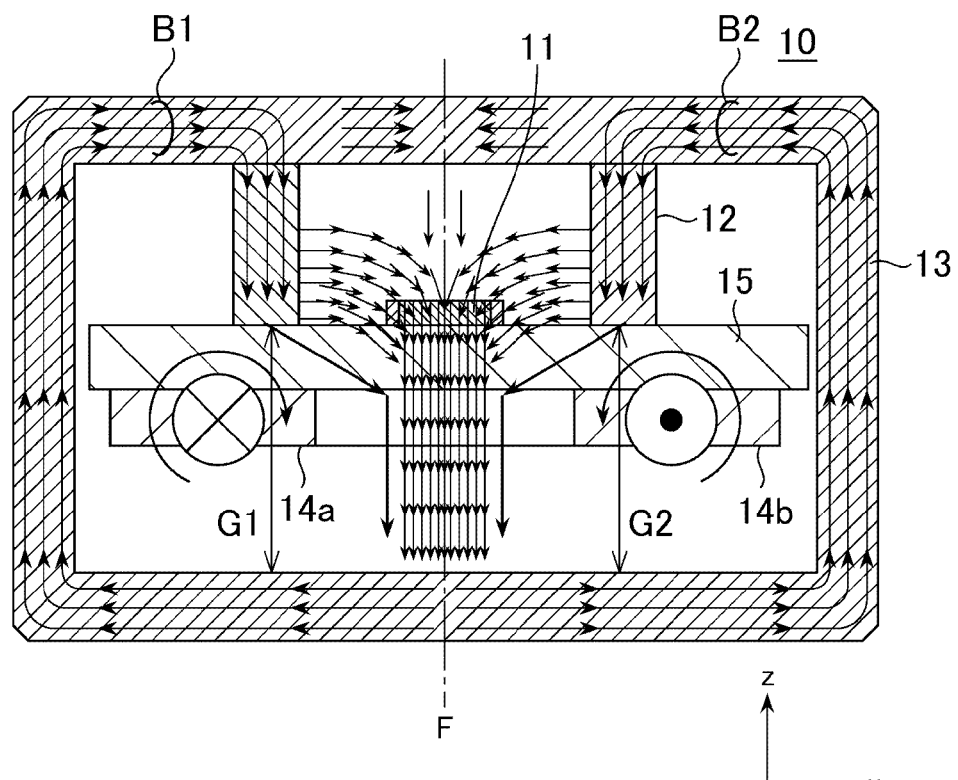

FIG. 9A is a perspective view of a magnetic field detection device 10 according to a sixth embodiment of the present invention. FIG. 9B is a view in which a second magnetic body core 13 of FIG. 9A is slightly displaced so as to show an inner structure of the magnetic field detection device 1. FIG. 9C is a view transparently illustrating a first magnetic core 12 and a substrate 15 of FIG. 9B so as to show a structure of a conductor 14. FIG. 10 is a top view of the substrate 15. FIGS. 11A and 11B are cross-sectional views taken along line C-C' and line D-D' as shown in FIG. 9A, respectively. Magnetic field lines are plotted in FIG. 11B.

As illustrated in FIGS. 9A and 9B, a magnetic field detection device 10 according to the present embodiment includes a magnetic field detection element 11 that detects a magnetic field, a first magnetic body core 12 provided so as to surround the magnetic field detection element 11 from four directions in x-y plane (first plane), a second magnetic body core 13 provided so as to surround the first magnetic body core 12 from four directions in x-z plane (second plane), and a conductor 14 (first and second magnetic field sources) provided between a lower surface of the first magnetic body core 12 and a lower side inner wall surface of the second magnetic body core 13. The magnetic field detection element 11 and first magnetic body core 12 are disposed on a resin printed board 15 disposed on the conductor 14.

The magnetic field detection device 10 is a current sensor that detects a magnetic field generated by a current flowing through the conductor 14 to thereby detect whether a current flows through the conductor 14. The magnetic field detection device 10 is used in a versatile manner for motors, industrial equipment, and automobiles.

The conductor 14 is a bus bar (electric line used for electric energy distribution) formed by a plate conductor. As illustrated in FIG. 9C, the conductor 14 has a folded plane-symmetrical shape with respect to y-z plane (third plane) passing through a center of the magnetic field detection element 11. More specifically, as illustrated in FIG. 11B, the conductor 14 has a portion 14a provided just below an x-direction left side surface of the first magnetic body core 12 and a portion 14b provided just below an x-direction right side surface of the first magnetic body core 12. The portions 14a and 14b are connected to each other on the far side of FIG. 11B. Note that, as illustrated in FIG. 11A, a portion 14c (folded portion) of the conductor 14 that is parallel to x-direction is preferably disposed at a region not overlapping the first magnetic body core 12 and an inner region thereof as viewed in z-direction, that is, outside the first magnetic body core 12. This can prevent a magnetic field generated from the folded portion 14c of the conductor 14 from entering the inside of a space surrounded by the first magnetic body core 12.

The conductor 14 functions as first and second magnetic field sources that generate the magnetic fields B1 and B2 illustrated in FIG. 11B, respectively, when a current flows therethrough. The magnetic fields B1 and B2 have opposite magnetic flux directions. This is because, due to the folded structure, as illustrated in FIG. 11B, current direction in the portion 14a and that in the portion 14b are opposite to each other.

The first and second magnetic body cores 12 and 13 are each an annular magnetic body including a ferromagnetic material and they constitute magnetic paths of the magnetic fields B1 and B2 generated from the conductor 14, respectively. The first and second magnetic body cores 12 each have a plane-symmetrical closed curve structure with respect to y-z plane passing through the center of the magnetic field detection element 11. A normal vector (z-direction vector) of the closed curve constituted by the first magnetic body core 12 and a normal vector (y-direction vector) of the closed curve constituted by the second magnetic body core 13 are perpendicular to each other.

An upper surface of the first magnetic body core 12 and an upper side inner wall surface of the second magnetic body core 13 magnetically contact each other. Thus, as illustrated in FIG. 11B, a part of the magnetic flux flowing through an upper surface of the second magnetic body core 13 enters inside the first magnetic body core 12 from the upper surface thereof. The "magnetically contact each other" means that the upper surface of the first magnetic body core 12 and upper side inner wall surface of the second magnetic body core 13 are brought close to each other to such a degree that it is plausible to think there is no magnetic gap therebetween. For example, when the upper surface of the first magnetic body core 12 and upper side inner wall surface of the second magnetic body core 13 are adhered by adhesive, a minor space corresponding to the adhesive is generated therebetween; however, this minor space can generally be ignored as the magnetic gap.

A third gap and a fourth gap may be formed between the upper surface of the first magnetic body core 12 and the upper side inner wall surface of the second magnetic body core 3 when necessary in controlling a magnetic field generated from the conductor 14. Further, the third gap and the fourth gap may be formed in any of the first and second magnetic bodies 12 and 13.

The lower surface of the first magnetic body core 12 and the lower side inner wall surface of the second magnetic body core 13 are spaced apart from each other as illustrated in FIG. 11B, thus forming a gap G1 and a gap G2 provided in the magnetic path extending from the upper surface of the second magnetic body core 13 to the first magnetic body core 12.

The configuration corresponding to the conductor 14 and first and second magnetic cores 12 and 13 includes the same configuration as in the magnetic field detection device 1 of FIG. 7. That is, the portions 14a and 14b of the conductor 14 correspond to the conductors 3 and 6 of FIG. 7, respectively, the second magnetic body core 13 corresponds to the C-cores 2 and 5, excluding the end portions 2c and 5c, and the first magnetic body core 12 corresponds to the end portions 2c and 5c. Thus, the magnetic flux going out through the inner wall surface of the first magnetic body core 12 gathers together centering around y-z plane (y-z plane including line F illustrated in FIG. 11B) passing through the center of the magnetic field detection element 11 and enters the integrally formed lower side inner wall surface of the second magnetic body core 13. By disposing the magnetic field detection element 11 in a region between the inner wall surfaces of the first magnetic body core 12, especially, in a region between the inner wall surfaces of the first magnetic body core 12 around y-z plane including the line F, the magnetic field detection element 11 can satisfactorily detect both the magnetic fields B1 and B2.

Both the GMR element and Hall element can be used as the magnetic field detection element 11. In a case where the GMR element is used as the magnetic field detection element 11, it is preferable to adopt the full-bridge circuit having the same configuration as that of FIG. 2, as illustrated in FIG. 10. Note that it is assumed that line E of FIG. 10 corresponds to line A of FIG. 2 and that line E is located on y-z plane like line F of FIG. 11B. Further, as to the connection state of the GMR elements R1 to R4 and PIN directions thereof, it is preferable to adopt the same configuration as in the example illustrated in FIG. 8. As a result, measuring a difference Va-Vb between the voltages Va and Vb allows confirmation of an application of the magnetic fields B1 and B2 generated from the conductor 14. Further, confirming the sign of the difference Va-Vb allows detection of the direction of the magnetic field, thereby detecting the direction of the current flowing through the conductor 14. Further, influence of a uniform external magnetic field such as geomagnetism can be advantageously eliminated since the PIN directions of all the GMR elements R1 to R4 are the same.

As described above, according to the magnetic field detection device 10 of the present embodiment, the magnetic path is constituted by the first and second magnetic body cores 12 and 13, and the gap G1 and the gap G2, in both of which the lower surface of the first magnetic body core 12 and the lower side inner wall surface of the second magnetic body core serve as the magnetic pole surfaces thereof, are constituted. Therefore, the C core 2 (first magnetic body) and C core 5 (second magnetic body) described in the fifth embodiment are realized by the first and second magnetic body cores 12 and 13, thus increasing the degree of freedom in selecting the type of the magnetic field detection element 11.

Further, according to the magnetic field detection device 10 of the present embodiment, the first and second magnetic body cores 12 and 13 shield an external magnetic field, allowing an increase in resistance against the external magnetic field. A more specific description will be made below on this point.

Figure 12A:
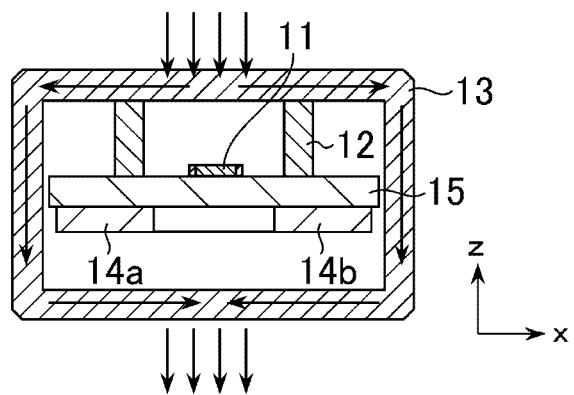
FIG. 12A is a view obtained by plotting an external magnetic field coming from z-direction in a cross-sectional view of the magnetic field detection device of FIG. 11B.

FIG. 12A is a view obtained by plotting an external magnetic field coming from z-direction in a cross-sectional view of the magnetic field detection device 10 of FIG. 11B. As illustrated, the external magnetic field coming from z-direction is shielded by the second magnetic body core 13 and does not reach the magnetic field detection element 11.

Figure 12B:
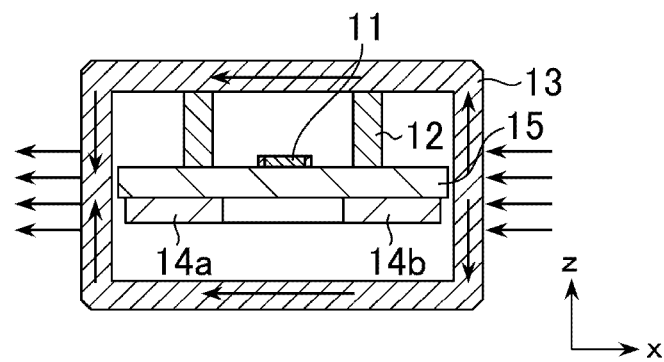
FIG. 12B is a view obtained by plotting an external magnetic field coming from x-direction in a cross-sectional view of the magnetic field detection device of FIG. 11B.

FIG. 12B is a view obtained by plotting an external magnetic field coming from x-direction in the cross-sectional view of the magnetic field detection device 10 of FIG. 11B. As illustrated, the external magnetic field coming from x-direction is also shielded by the second magnetic body core 13 and does not reach the magnetic field detection element 11.

Figure 12C:
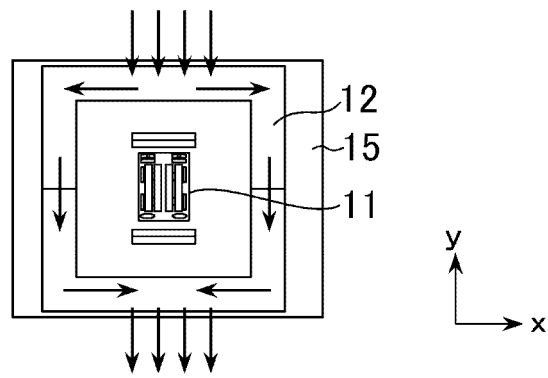
FIG. 12C is a view obtained by plotting an external magnetic field coming from y-direction in a top view of the substrate of FIG. 10.

FIG. 12C is a view obtained by plotting an external magnetic field coming from y-direction in a top view of the substrate 15 of FIG. 10. As illustrated, the external magnetic field coming from y-direction is shielded by the first magnetic body core 12 and does not reach the magnetic field detection element 11.

Figure 12D:
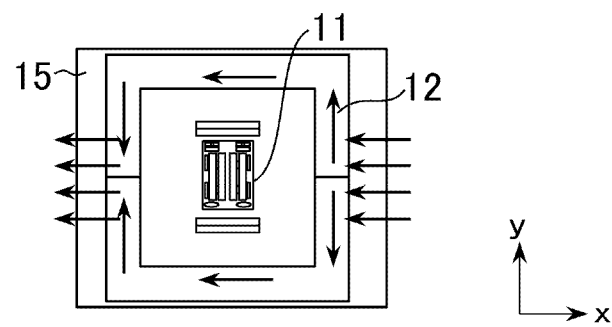
FIG. 12D is a view obtained by plotting an external magnetic field coming from x-direction in a top view of the substrate of FIG. 10.

FIG. 12D is a view obtained by plotting an external magnetic field coming from x-direction in the top view of the substrate 15 of FIG. 10. As illustrated, the external magnetic field coming from x-direction is shielded also by the first magnetic body core 12.

As described above, according to the magnetic field detection device 10 of the present embodiment, the external magnetic field coming from any of x-, y-, and z-directions can satisfactorily be shielded by at least one of the first and second magnetic body cores 12 and 13. Thus, the resistance against the external magnetic field can be increased.

Figure 13A:
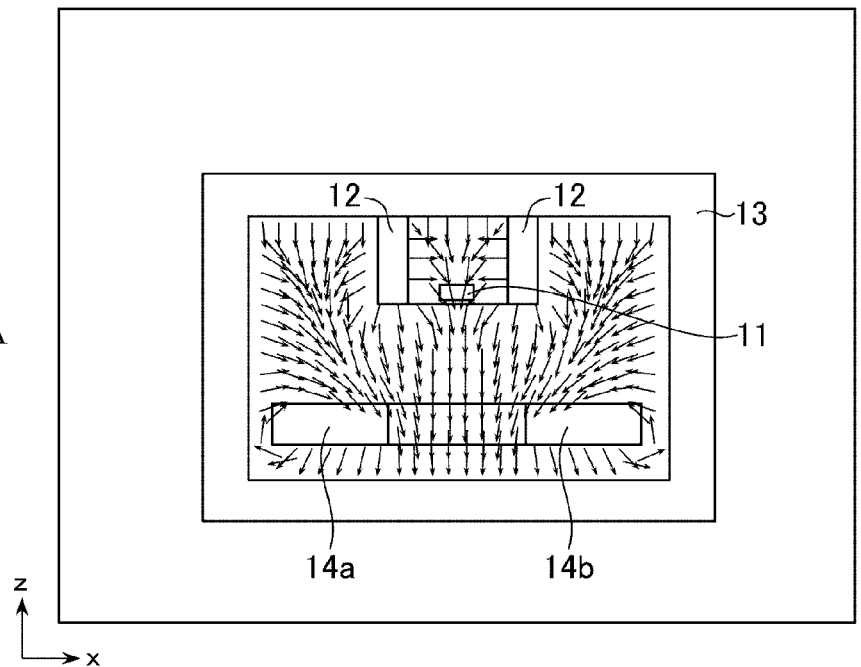
FIG. 13A is a view representing a simulation result of a magnetic field around the magnetic field detection device.
Figure 13B:
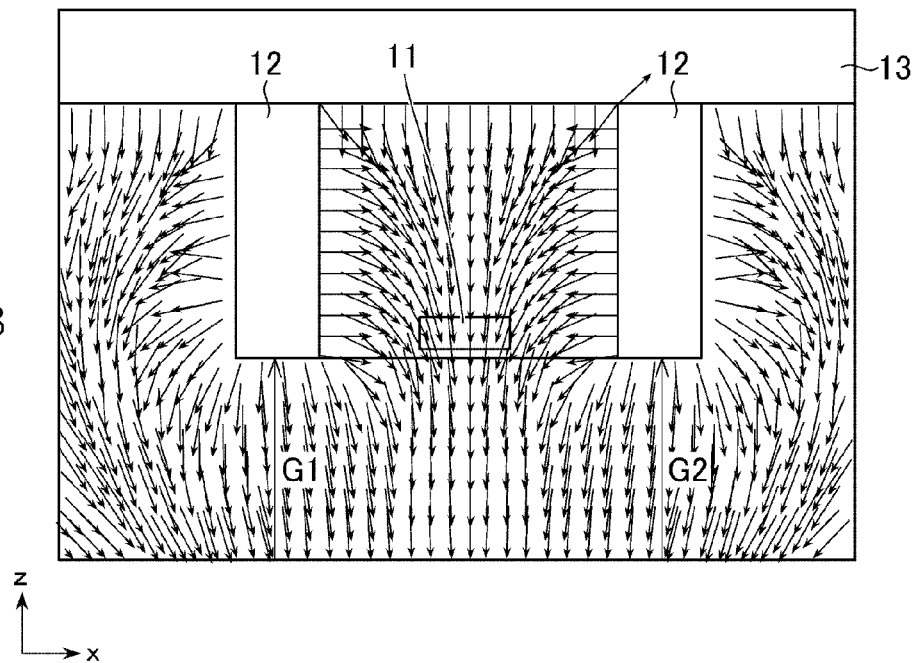
FIG. 13B illustrates a region in the vicinity of the first magnetic body core of FIG. 13A in an enlarged manner.

FIGS. 13A and 13B are each a view representing a simulation result of a magnetic field around the magnetic field detection device 10. In each of FIGS. 13A and 13B, a cross-sectional view of the magnetic field detection device 10 of FIG. 11B is illustrated with magnetic field lines therearound. FIG. 13A illustrates the entire magnetic field detection device 10, and FIG. 13B illustrates a region in the vicinity of the first magnetic body core 12 in an enlarged manner.

As illustrated in FIGS. 13A and 13B, a direction of the magnetic flux going out of the inner wall surface of the first magnetic body core 12 is initially parallel to x-direction, gradually inclined as separated apart from the inner wall surface, and ultimately parallel to z-direction. The magnetic flux passing around the left and right end portions of the magnetic field detection element 11 includes an x-direction component, and thus, a pair of the GMR elements can suitably detect the magnetic field.

As illustrated in FIGS. 13A and 13B, a magnetic field around the magnetic field detection device 10 includes also a z-direction component. Thus, the Hall element can be used as the magnetic field detection element 11 according to a regular installation direction (direction in which the magnetic field detection direction is parallel to the normal direction of the substrate 15). In a case where the Hall element is used as the magnetic field detection element 11, the Hall element may be slightly displaced in the left-right direction from the x-direction center line. This is because that the magnetic flux having the z-direction component passes through the magnetic field detection element 11 even in such an arrangement.

Figure 14A:
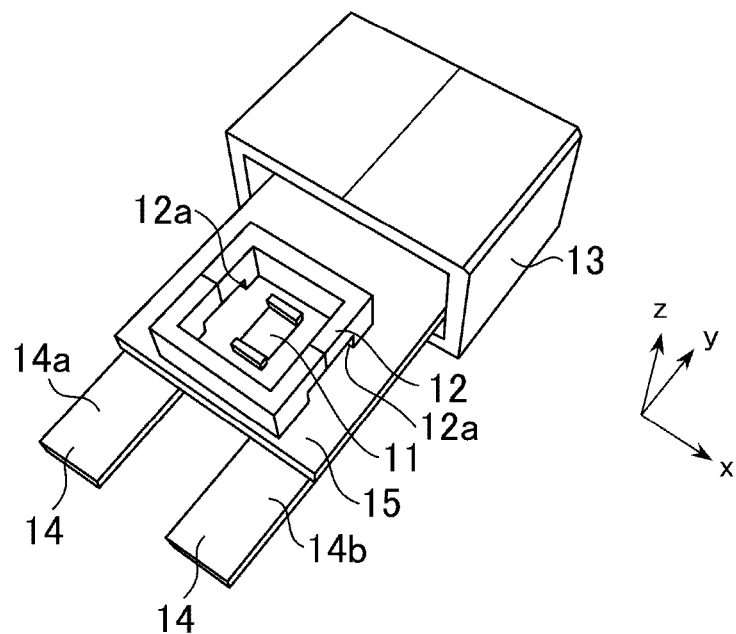
FIG. 14A is a perspective view illustrating the magnetic field detection device according to a seventh embodiment of the present invention.
Figure 14B:
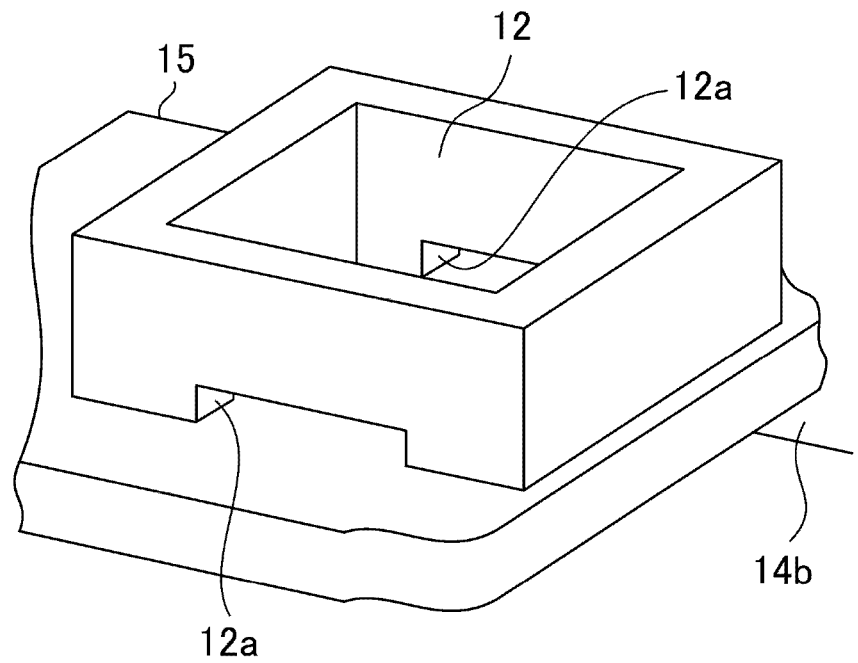
FIG. 14B is a perspective view illustrating the magnetic field detection device as viewed in a different direction from a view direction in FIG. 14A.

FIG. 14A is a perspective view illustrating the magnetic field detection device 10 according to a seventh embodiment of the present invention. In FIG. 14A, the second magnetic body core 13 is slightly displaced so as to show an inner structure of the magnetic field detection device 10, as in the case of FIG. 9B. FIG. 14B is a perspective view illustrating the magnetic field detection device 10 as viewed in a different direction from a view direction in FIG. 14A. The magnetic field detection device 10 according to the present embodiment differs from the magnetic field detection device 10 according to the sixth embodiment in the shape of the first magnetic body core 12. A more specific description will be made below on this point.

As illustrated in FIGS. 14A and 14B, the first magnetic body core 12 according to the present embodiment has a cut 12a at a lower side of x-direction both side surfaces thereof. As a result, a part of the lower surface of the first magnetic body core 12 is positioned above a lower surface of the magnetic field detection element 11.

According to the magnetic field detection device 1 of the present embodiment, appropriate adjustment of the size of the cut 12a allows control of a flow of the magnetic field, which in turn allows control of the sensitivity of the magnetic field detection element 11. A more specific description will be made below on this point.

Figure 15:
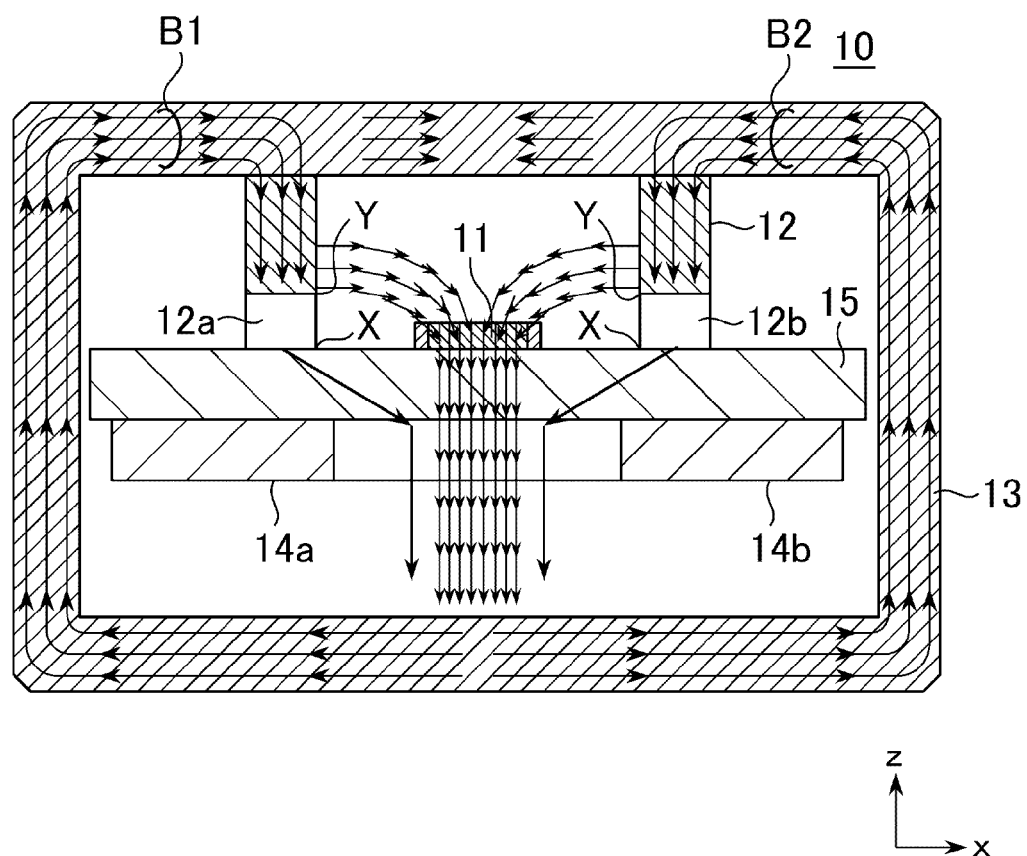
FIG. 15 is a cross-sectional view of the magnetic field detection device according to the seventh embodiment of the present invention.

FIG. 15 is a cross-sectional view of the magnetic field detection device 10 according to the present embodiment which corresponds to the cross-sectional view of FIG. 11B. As can be seen from a comparison between FIG. 11B and FIG. 15, a position of the inner wall surface of the first magnetic body core 12 where the magnetic flux goes out differs. That is, in the configuration of FIG. 11B, the magnetic flux goes out at a position above point X illustrated in FIG. 15; while in the present embodiment, the magnetic flux goes out only at a position above point Y higher than point X.

As is clear from the magnetic field lines plotted in FIG. 11B, in the configuration of FIG. 11B, the magnetic flux going out at a comparatively lower side of the inner wall surface of the first magnetic body core 12 does not pass the magnetic field detection element 11; while in the present embodiment, as described in FIG. 15, more magnetic flux passes the magnetic field detection element 11. Thus, the magnetic field detection element 11 according to the present embodiment can detect the magnetic field with higher sensitivity than the magnetic field detection element 11 of FIG. 11B.

As described above, the amount of the magnetic flux passing through the magnetic field detection element 11 can be controlled depending on the presence/absence of the cut 12a. Further, the amount of the magnetic flux passing through the magnetic field detection element 11 can be controlled by changing the size (height and/or width) of the cut 12a. Thus, according to the magnetic field detection device 10 of the present embodiment, the sensitivity of the magnetic field detection element 11 can be controlled depending on the presence/absence of the cut 12a and by appropriately controlling the size thereof.

Figure 16:
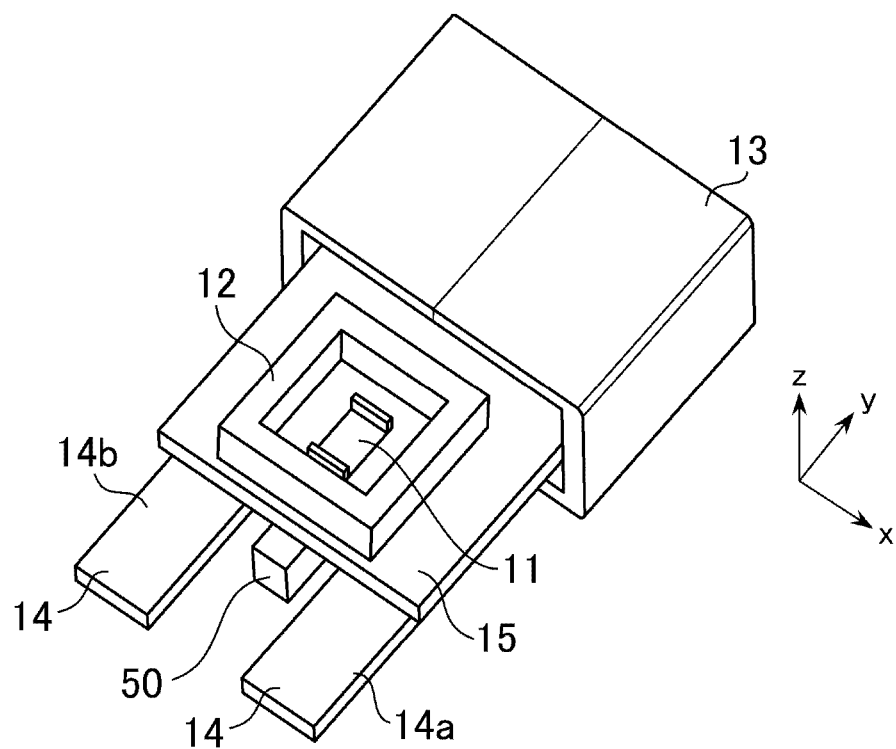
FIG. 16 is a perspective view illustrating the magnetic field detection device according to an eighth embodiment of the present invention.
Figure 17:
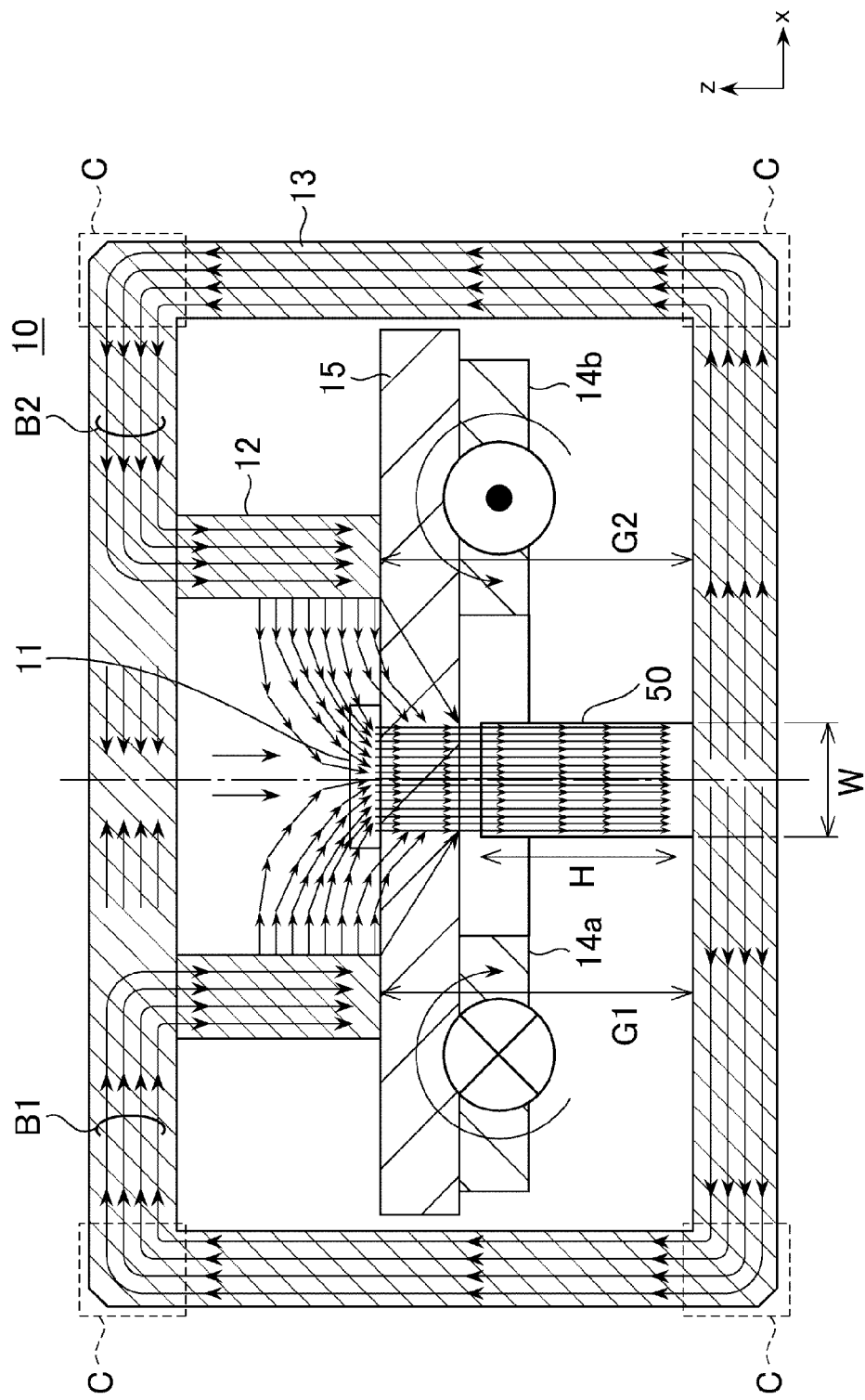
FIG. 17 is a cross-sectional view of the magnetic field detection device according to the eighth embodiment of the present invention which corresponds to the cross-sectional view of FIG. 10B.

FIG. 16 is a perspective view illustrating the magnetic field detection device 10 according to an eighth embodiment of the present invention. In FIG. 16, the second magnetic body core 13 is slightly displaced so as to show an inner structure of the magnetic field detection device 10, as in the case of FIG. 9B. FIG. 17 is a cross-sectional view of the magnetic field detection device 10 according to the present embodiment which corresponds to the cross-sectional view of FIG. 10B. The magnetic field detection device 10 according to the present embodiment differs from the magnetic field detection device 10 according to the sixth embodiment in the point that it includes a third magnetic body core 50. A more specific description will be made below on this point.

As illustrated in FIGS. 16 and 17, the third magnetic body core 50 is disposed at a position overlapping the magnetic field detection element 11 as viewed in z-direction, the position being between the lower surface (more specifically, lower surface of the substrate 15) of the magnetic field detection element 11 and the second magnetic body core 13. A height length H of the third magnetic body core 50 is set shorter than a distance between the lower surface of the substrate 15 and the lower side inner wall surface of the second magnetic body core 13.

When the third magnetic body core 50 is formed of the same material of the first and second magnetic body cores 12 and 13, an x-direction width W of the third magnetic body core 50 is preferably set to twice or more the maximum thickness (maximum value of a thickness of a portion other than a corner C illustrated in FIG. 17) of the second magnetic body core 13. This makes it difficult for the third magnetic body core 50 to be saturated and allows saturation levels of the third magnetic body core 50 and the second magnetic body core 13 to coincide with each other. More specifically, it is preferable to set the thickness of the second magnetic body core and width W to 1.5 mm and 3.0 mm, respectively. Further, it is preferable to set the width W to a value larger than the x-direction width of the magnetic field detection element 11.

The width W can be reduced when the third magnetic body core 50 is formed of a material having a high saturation magnetic flux density. A reduction of the width W increases the amount of the magnetic field that passes through the magnetic field detection element 11 in x-direction to allow a reduction in the area of the magnetic field detection element 11 formed integrally on the substrate 15, thus achieving miniaturization. Forming the third magnetic body core 50 using the material having a high saturation magnetic flux density makes it difficult for the third magnetic body core 50 to be saturated, which in turn allows an increase in the density of a current flowing through the conductor 14. Further, from a standpoint that the magnetic flux passing through the first and second magnetic body cores 12 and 13 centers into the third magnetic body core 50, the saturation magnetic flux density of the third magnetic body core 50 is preferably made larger than those of the first and second magnetic body cores 12 and 13.

A depth (y-direction width) of the third magnetic body core 50 is preferably set slightly larger than the depth of the first magnetic body core 12. If the depth of the third magnetic body core 50 is smaller than that of the first magnetic body core 12, due to a problem in terms of assembly accuracy, in a worst-case scenario, a case may occur where the third magnetic body core 50 cannot be arranged below the magnetic field detection element 11 or where the magnetic field is disturbed. Such a problem can be solved by setting the depth of the third magnetic body core 50 larger than that of the first magnetic body core 12.

Although an upper surface of the third magnetic body core 50 is opposed in parallel to the upper side inner wall surface of the second magnetic body core 13, these two parallel-opposed magnetic pole surfaces do not substantially constitute a magnetic gap. This is because most of the magnetic flux flowing from the lateral side of the second magnetic body core 13 to upper side thereof flows to the first magnetic body core 12 side as illustrated in FIG. 17 with the result that the amount of the magnetic flux that passes around the surface of the second magnetic body core 13 that is opposed to the upper surface of the third magnetic body core 50 becomes very small. Therefore, also in the present embodiment, the magnetic field detection element 11 is disposed outside the gap (outside the gap G1 and the gap G2).

The third magnetic body core 50 magnetically contacts the second magnetic body core 13 at a lower surface thereof to constitute the projection portion 2f described in the fourth embodiment. That is, the magnetic flux going out of the inner wall surface of the first magnetic body core 12 converges on the upper surface of the third magnetic body core 50. Then, the third magnetic body core 50 causes the magnetic flux to flow toward the second magnetic body core 13. As a result, as can be seen from a comparison between FIG. 17 and FIG. 11B, the amount of the magnetic flux passing through the magnetic field detection element 11 is larger in the magnetic field detection device 10 of the present embodiment than in the magnetic field detection device 10 of the sixth embodiment, thereby enhancing the magnetic field detection sensitivity of the magnetic field detection element 4. In another respect, the magnetic field detection sensitivity of the magnetic field detection element 11 can be controlled depending on presence/absence of the third magnetic body core 50.

The magnetic field detection sensitivity of the magnetic field detection element 11 can also be controlled by controlling a height H of the third magnetic body core 50. That is, the amount of the magnetic flux passing through the third magnetic body core 50 is increased as the height H becomes larger. Accordingly, the amount of the magnetic flux passing through the magnetic field detection element 11 is increased to thereby enhance the magnetic field detection sensitively of the magnetic field detection element 11.

The third magnetic body core 50 may be divided into two or more parts. In this case, it is preferable that the plurality of the third magnetic body cores 50 are disposed symmetrically with respect to y-z plane and that the magnetic field detection element 11 is disposed symmetrically with respect to y-z plane. With this arrangement, abridge circuit can be constituted by using the plurality of magnetic field detection elements 50.

As described above, according to the magnetic field detection device 10 of the present embodiment, providing the third magnetic body core 50 allows the magnetic field detection sensitivity of the magnetic field detection element 4 to be enhanced. Further, the magnetic field detection sensitivity of the magnetic field detection element 11 can be controlled by controlling the height H of the third magnetic body core 50.

A plurality of the third magnetic body core 50 may be provided in x-y plane. Further, a plurality of the third magnetic body cores 50 may be stacked in z-direction. Further, the third magnetic body core 50 may be formed independently of the second magnetic body core 12 or formed integrally with the second magnetic body core 12.

Figure 18:
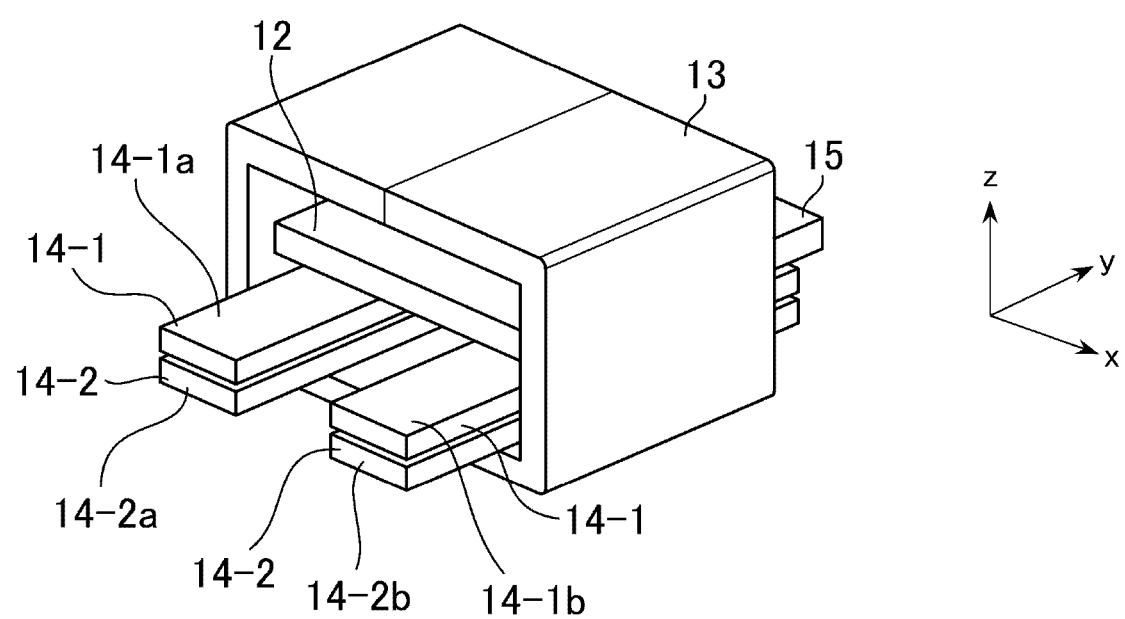
FIG. 18 is a perspective view illustrating the magnetic field detection device according to a ninth embodiment of the present invention.
Figure 19A:
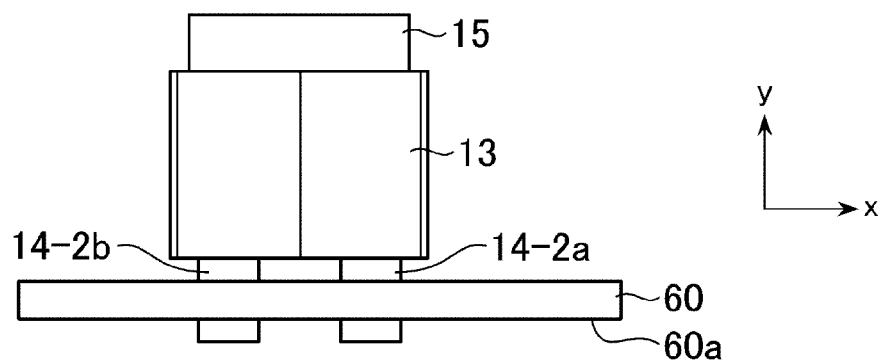
FIG. 19A is a side view illustrating a state where the magnetic field detection device according to the ninth embodiment of the present invention is mounted on a substrate.
Figure 19B:
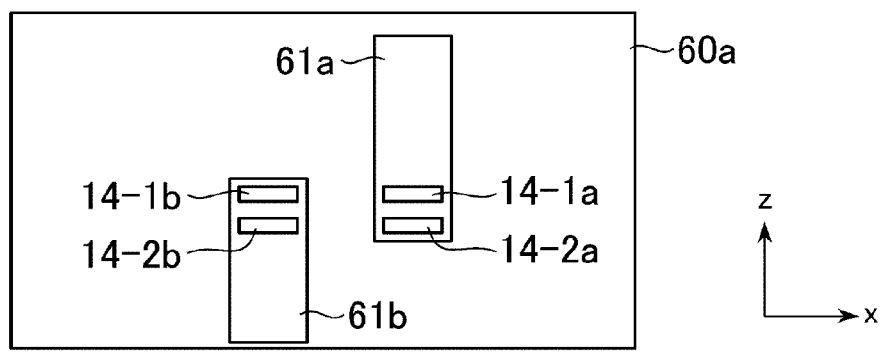
FIGS. 19B and 19C are each a plan view of a rear surface of the substrate, respectively.
Figure 19C:
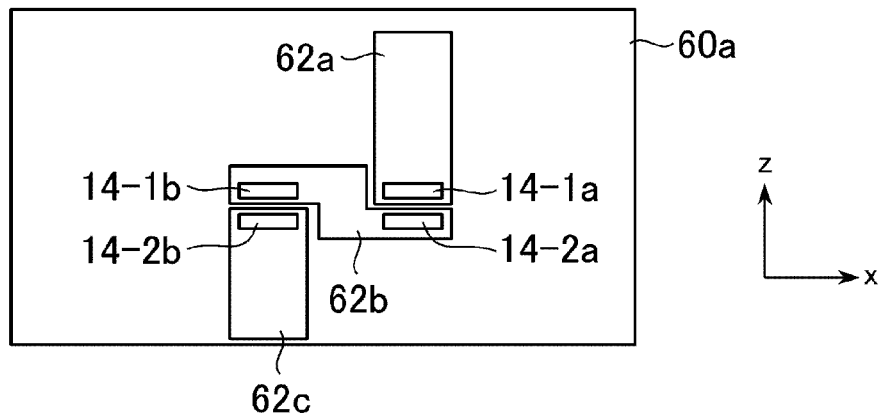
Figure 20A:
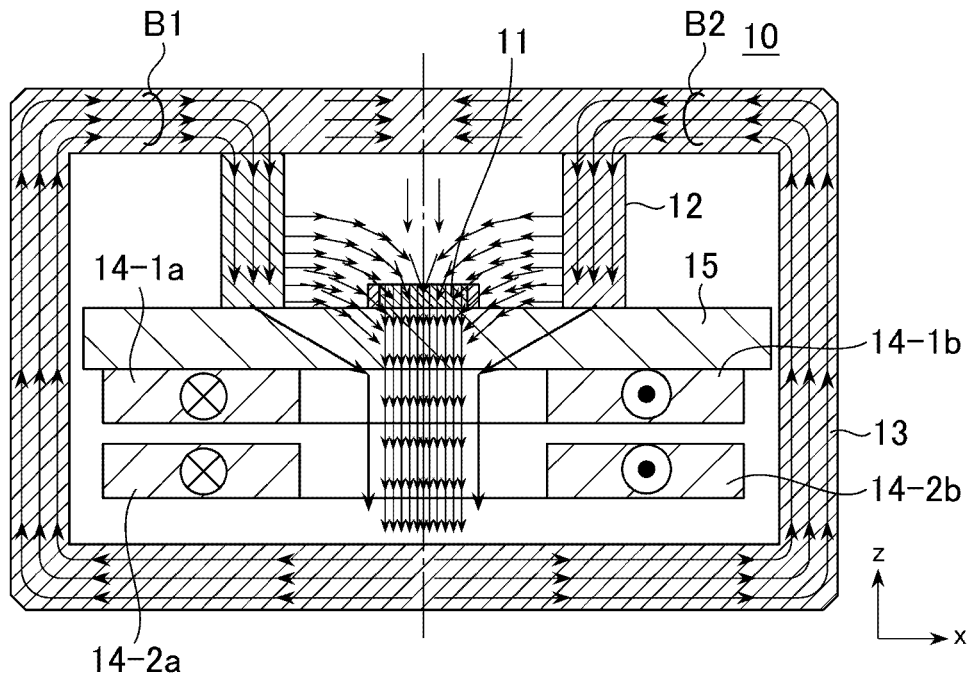
FIGS. 20A and 20B are each a cross-sectional view of the magnetic field detection device according to the ninth embodiment of the present invention, each of which corresponds to the cross-sectional view of FIG. 10B.
Figure 20B:
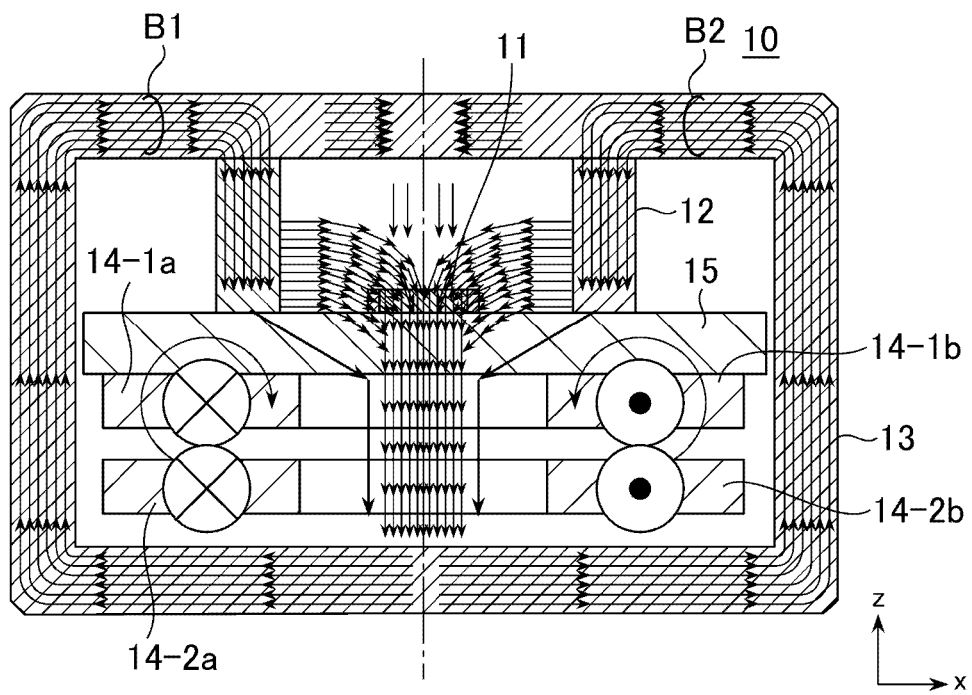

FIG. 18 is a perspective view illustrating the magnetic field detection device 10 according to a ninth embodiment of the present invention. FIG. 19A is a side view illustrating a state where the magnetic field detection device 10 according to the present embodiment is mounted on a substrate 60. FIGS. 19B and 19C are each a plan view of a rear surface 60a of the substrate 60, which are first and second examples of the magnetic field detection device 10 according to the present embodiment, respectively. FIGS. 20A and 20B are each a cross-sectional view of the magnetic field detection device 10 according to the present embodiment, each of which corresponds to the cross-sectional view of FIG. 10B. FIGS. 20A and 20B correspond to the first and second examples, respectively. The magnetic field detection device 10 according to the present embodiment differs from the magnetic field detection device 10 according to the sixth embodiment in that it includes two conductors 14 (conductors 14-1 and 14-2). A more specific description will be made below on this point.

The conductors 14-1 and 14-2 each have the same configuration as that of the conductor 14 of the sixth embodiment. That is, as illustrated FIG. 18, the conductor 14-1 has a portion 14-1a provided just below an x-direction left side surface of the first magnetic body core 12 and a portion 14-1b provided just below an x-direction right side surface of the first magnetic body core 12, the portion 14-1a and portion 14-1b being connected on a y-direction depth side of FIG. 18. Similarly, the conductor 14-2 has a portion 14-2a provided just below the x-direction left side surface of the first magnetic body core 12 and a portion 14-2b provided just below the x-direction right side surface of the first magnetic body core 12, the portion 14-2a and portion 14-2b being connected on the y-direction depth side of FIG. 18.

An arrangement position of the conductor 14-1 in the magnetic field detection device 10 is the same as that of the conductor 14 of the sixth embodiment. The conductor 14-2 is disposed at a position overlapping the conductor 14-1 as viewed in z-direction, the position being between a lower surface of the conductor 14-1 and the second magnetic body core 13. A not-illustrated insulating layer is provided between the conductors 14-1 and 14-2 so as to electrically isolate the conductors 14-1 and 14-2 from each other.

As illustrated in FIG. 19A, the magnetic field detection device 10 according to the present embodiment is mounted on the substrate 60 with open ends of the conductors 14-1 and 14-2 running into the substrate 60. In the first example illustrated in FIG. 19B, the portions 14-1a and 14-2a are each electrically connected to a wiring pattern 61a on the rear surface 60a of the substrate 60, and the portions 14-1b and 14-2b are each electrically connected to a wiring pattern 61b on the rear surface 60a of the substrate 60. Thus, the conductors 14-1 and 14-2 are connected in parallel between the wiring patterns 61a and 61b. On the other hand, in the second example illustrated in FIG. 19C, the portion 14-1a is electrically connected to a wiring pattern 62a on the rear surface 60a of the substrate 60, the portions 14-1b and 14-2a are each electrically connected to a wiring pattern 62b on the rear surface 60a of the substrate 60, and the portion 14-2b is electrically connected to a wiring pattern 62c on the rear surface 60a of the substrate 60. Thus, the conductors 14-1 and 14-2 are connected in series between the wiring pattern 62a and 62c.

An amount of a current passing through the magnetic field detection device 10 in the first example in which the conductors 14-1 and 14-2 are connected in parallel is the same as that in the sixth embodiment illustrated in FIG. 11B. Thus, as illustrated in FIG. 20A, an amount of the magnetic flux passing through the first and second magnetic body cores 12 and 13 is nearly equal to that in the example of FIG. 11B. Accordingly, the magnetic field detection sensitivity of the magnetic field detection element 11 is also nearly equal to that in the sixth embodiment.

On the other hand, the amount of the current passing through the magnetic field detection device 10 in the second example in which the conductors 14-1 and 14-2 are connected in series is twice that in the sixth embodiment illustrated in FIG. 11B. Thus, as illustrated in FIG. 20B, the amount of the magnetic flux passing through the first and second magnetic body cores 12 and 13 is significantly increased as compared to that in the example of FIG. 11B, with the result that the amount of the magnetic flux passing through the magnetic field detection element 11 is increased. Accordingly, the magnetic field detection sensitivity of the magnetic field detection element 11 is increased as compared to that in the sixth embodiment.

As described above, according to the magnetic field detection device 10 of the present embodiment, the magnetic field detection sensitivity of the magnetic field detection element 11 can be controlled depending on a connection mode of the wiring pattern of the substrate 60.

Figure 21:
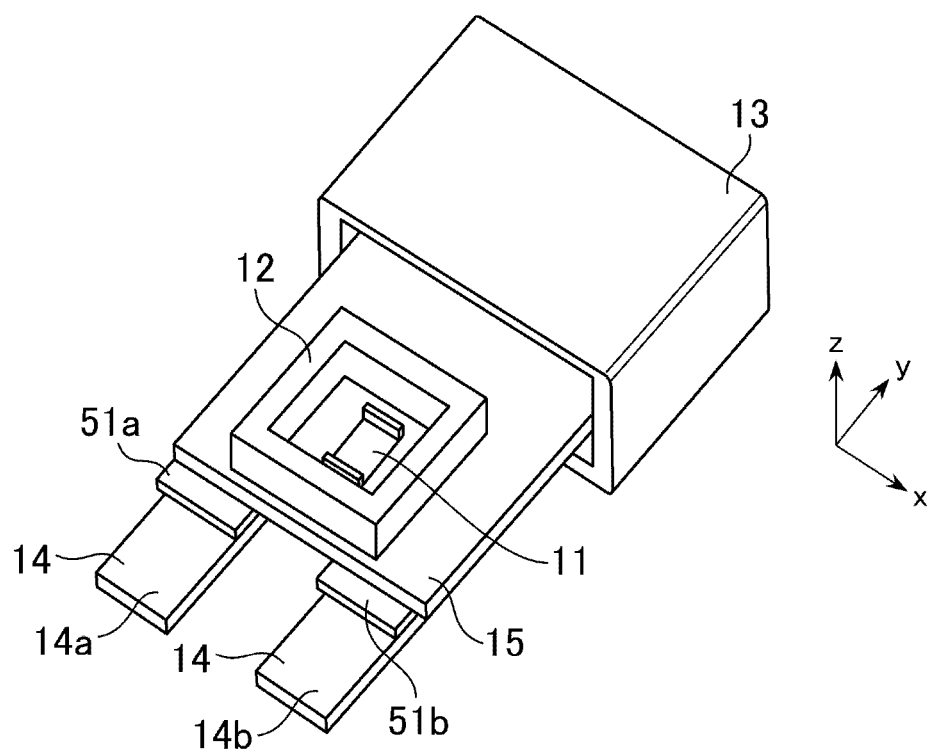
FIG. 21 is a perspective view illustrating the magnetic field detection device according to a tenth embodiment of the present invention.
Figure 22:
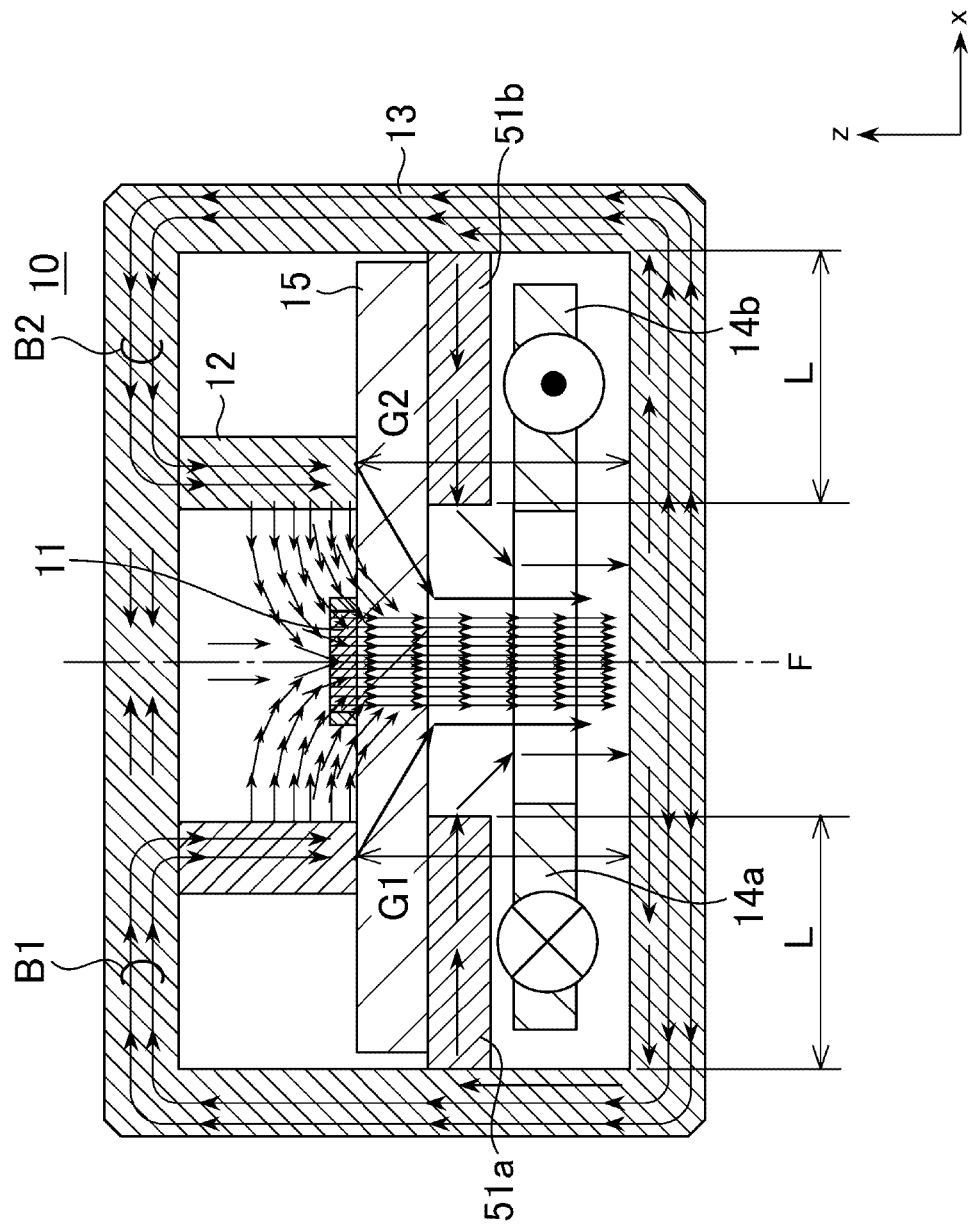
FIG. 22 is a cross-sectional view of the magnetic field detection device according to the tenth embodiment of the present invention which corresponds to the cross-sectional view of FIG. 10B.

FIG. 21 is a perspective view illustrating the magnetic field detection device 10 according to a tenth embodiment of the present invention. In FIG. 21, the second magnetic body core 13 is slightly displaced so as to show an inner structure of the magnetic field detection device 10 as in the case of FIG. 9B. FIG. 22 is a cross-sectional view of the magnetic field detection device 10 according to the present embodiment which corresponds to the cross-sectional view of FIG. 10B. The magnetic field detection device 10 according to the present embodiment differs from the magnetic field detection device 10 according to the sixth embodiment in that it includes fourth magnetic body cores 51a and 51b. A more specific description will be made below on this point.

The fourth magnetic body cores 51a and 51b are disposed between the portions 14a and 14b of the conductor 14 and a lower surface of the first magnetic body core 12 (more specifically, a lower surface of the substrate 15), respectively. As illustrated in FIG. 22, one ends of the respective fourth magnetic body cores 51a and 51b magnetically contact the second magnetic body core 13, and other ends thereof nearly overlap the inner wall surface of the first magnetic body core 12 as viewed in z-direction.

It is preferable that the fourth magnetic body cores 51a and 51b are disposed so as not to contact the conductor 14. It is because when contacting the conductor 14, the fourth magnetic body cores 51a and 51b become easy to be saturated. The fourth magnetic body cores 51a and 51b may be formed integrally with the second magnetic body core 13 or formed independently of the second magnetic body core 13. Further, the fourth magnetic body cores 51a and 51b may be bonded to the rear surface of the substrate 15.

As illustrated in FIG. 22, providing the fourth magnetic body cores 51a and 51b described above reduces the amount of the magnetic flux passing through the magnetic field detection element 11 as compared to the example of FIG. 11B. Thus, in the present embodiment, the magnetic field detection sensitivity of the magnetic field detection element 11 is reduced as compared to that in the sixth embodiment; however, a degree of the reduction in the sensitivity can be controlled by controlling an x-direction width L of each of the fourth magnetic body cores 51a and 51b. That is, the larger the width L, the larger the amount of the magnetic flux passing through the fourth magnetic body cores 51a and 51b becomes, and the smaller the amount of the magnetic flux passing through the magnetic field detection element 11. Thus, the magnetic field detection sensitivity of the magnetic field detection element 11 can be controlled by controlling the value of the width L.

As described above, according to the magnetic field detection device 10 of the present embodiment, controlling a value of the x-direction width L of each of the fourth magnetic body cores 51a and 51b allows control of the magnetic field detection sensitivity of the magnetic field detection element 11.

Although the embodiments of the present invention are described above, the invention is not limited to the embodiments. Various modifications can be made without departing from the scope of the present invention, and obviously the modifications are included in the scope of the present invention.

For example, in the above embodiments, as illustrated in FIGS. 3 and 8, the GMR element is disposed in such a manner that the PIN direction is parallel to x-direction. That is, the GMR element is disposed in such a manner that the x-direction component of the magnetic field can be measured. Alternatively, however, the GMR element may be disposed in such a manner that the PIN direction is directed between x-direction and z-direction (that is, the PIN direction is made inclined relative to x-axis) so as to measure both the x-direction component and z-direction component. In this case, an angle formed by the PIN direction and x-axis is preferably within ±45°, whereby not the z-direction component, but the x-direction component can be measured mainly.

Although a case where the GMR element and Hall element are used has been described in the above embodiments, the present invention may be applied to a case where a magnetoresistive element other than the GMR element, such as a TMR (Tunnel-Magneto-Resistance) element or an AMR (An-Isotropic Magneto-Resistance) element, is used as the magnetic field detection element.

Figure 23A:
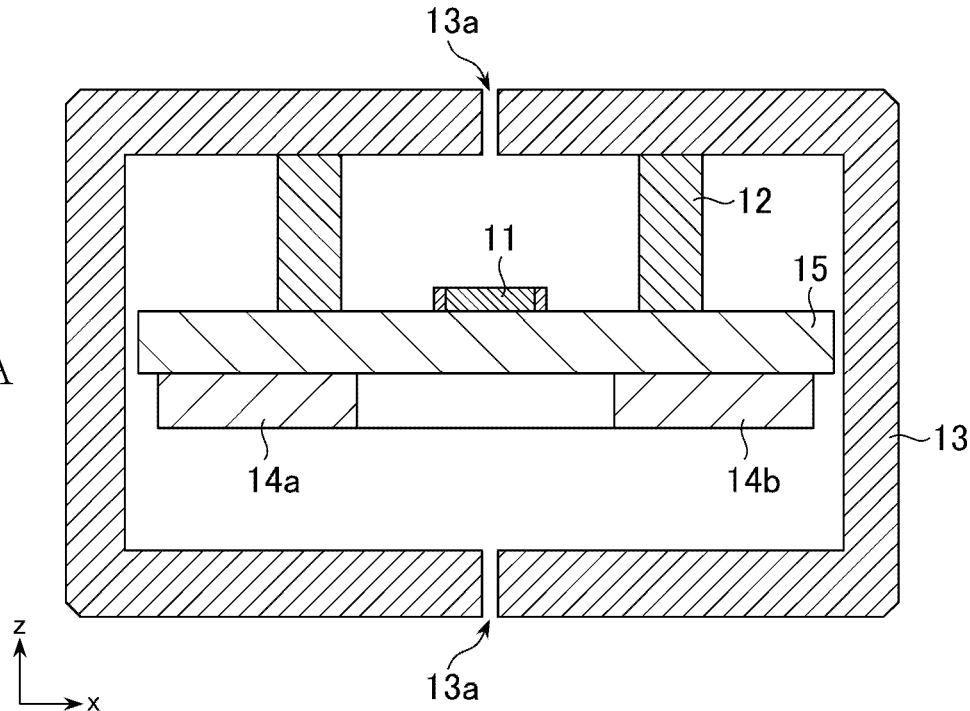
FIG. 23A illustrates an example in which slits are formed in the upper and lower surfaces of the second magnetic body core, respectively.
Figure 23B:
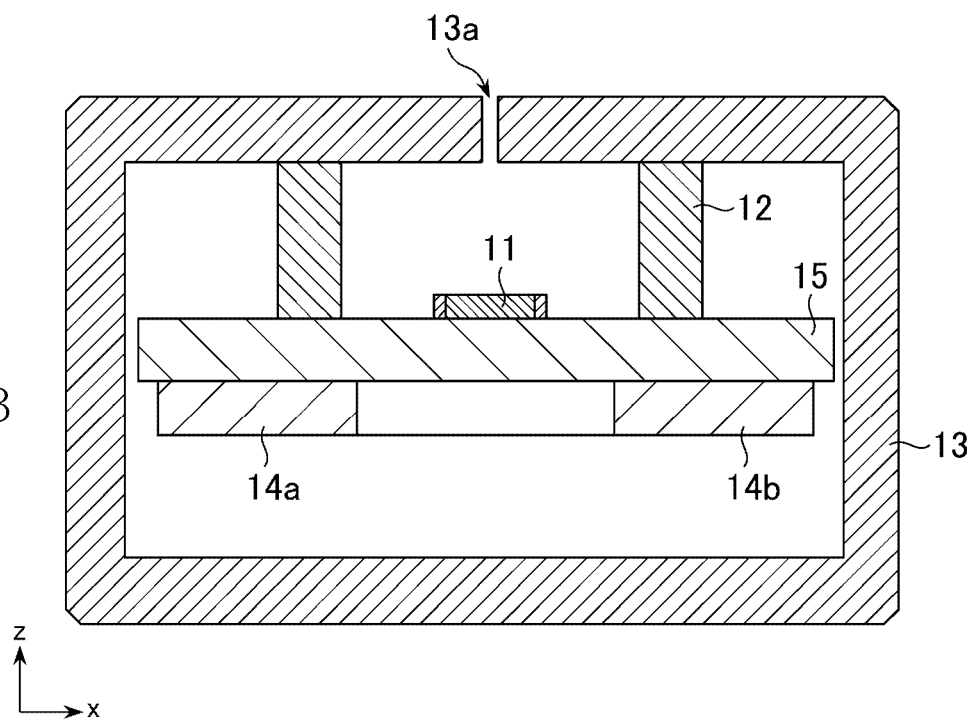
FIG. 23B illustrates an example in which a slit is formed in the upper surface of the second magnetic body core.
Figure 24A:
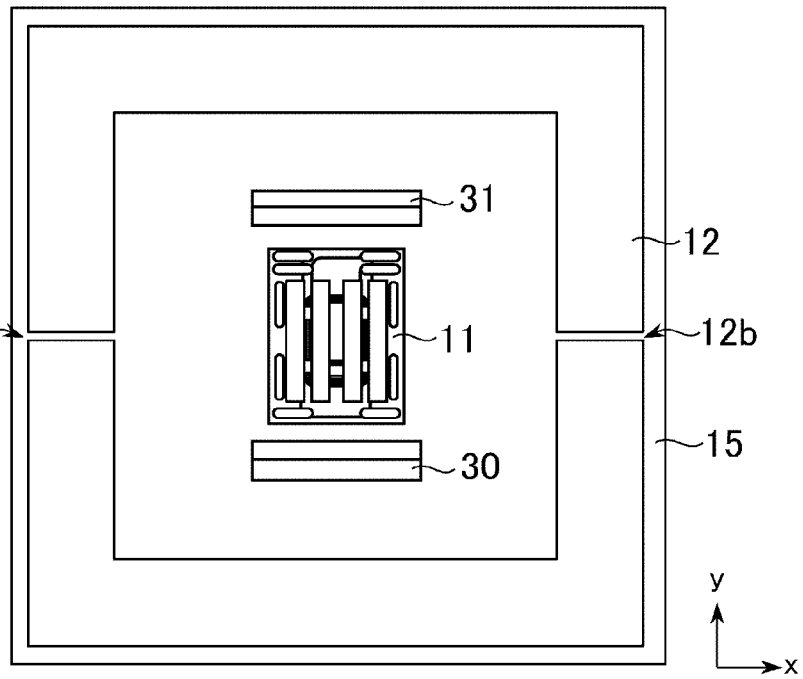
FIG. 24A illustrates an example in which slits are formed in the x-direction both side surfaces of the first magnetic body core.
Figure 24B:
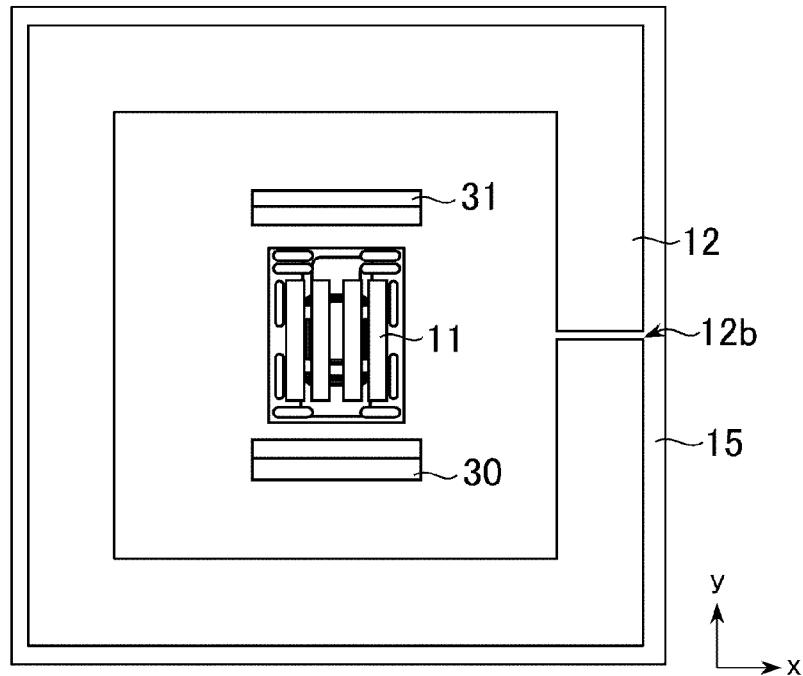
FIG. 24B illustrates an example in which the slit is formed in the x-direction one side surface of the first magnetic body core.

A minute slit may be formed in the first and second magnetic body cores 12 and 13 described in the sixth to tenth embodiments. FIG. 23A illustrates an example in which slits 13a are formed in the upper and lower surfaces of the second magnetic body core 13, respectively. FIG. 23B illustrates an example in which the slit 13a is formed in the upper surface of the second magnetic body core 13. FIG. 24A illustrates an example in which slits 12b are formed in the x-direction both side surfaces of the first magnetic body core 12. FIG. 24B illustrates an example in which the slit 12b is formed in the x-direction one side surface of the first magnetic body core 12. Although the presence of the slit slightly reduces shielding effect of the external magnetic field, the magnetic field detection device 10 can be made to function properly as a current sensor.

Figure 25A:
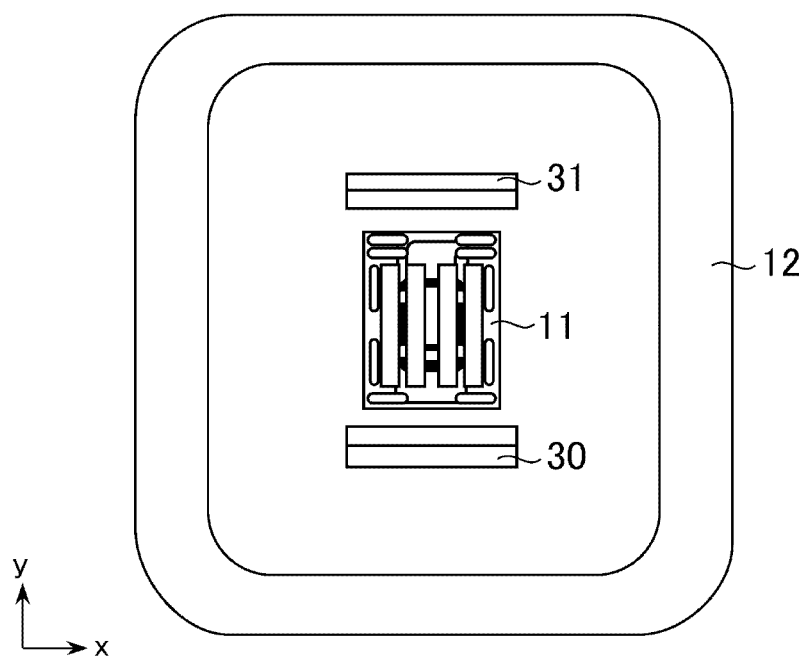
FIG. 25A illustrates an example in which the cross-sectional shape of the first magnetic body core is formed into a rounded corner square shape (example in which corners are each shaped into R- or C-shape)
Figure 25B:
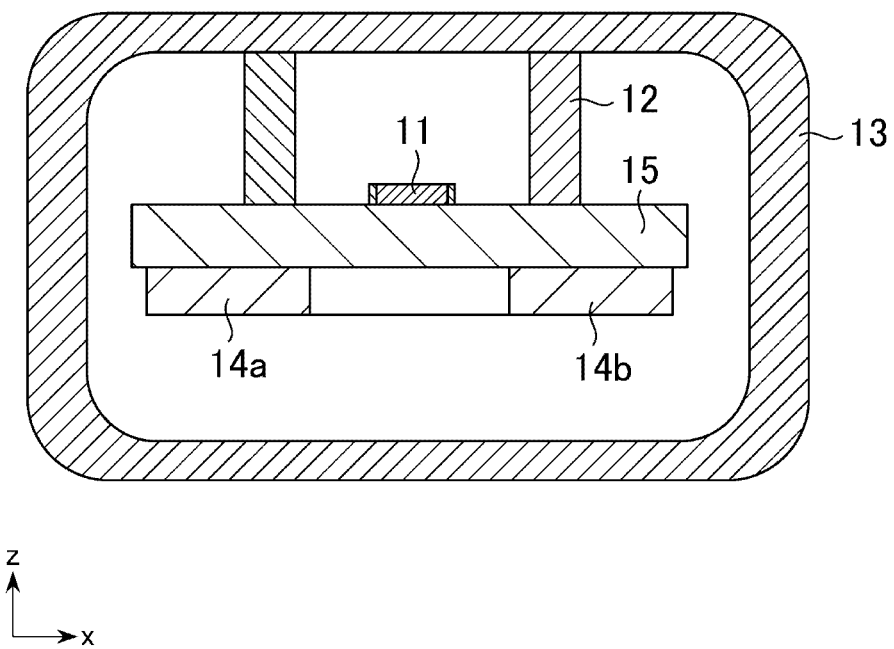
FIG. 25B illustrates an example in which the cross-sectional shape of the second magnetic body core is formed into a rounded corner square shape (example in which corners are each shaped into R- or C-shape)
Figure 26A:
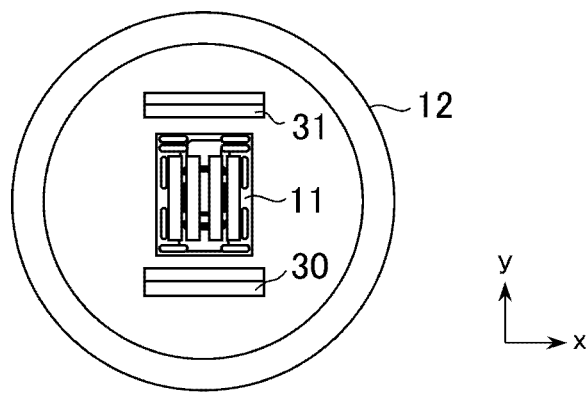
FIG. 26A illustrates an example in which the cross-sectional shape of the first magnetic body core is formed into a round (circular) shape.
Figure 26B:
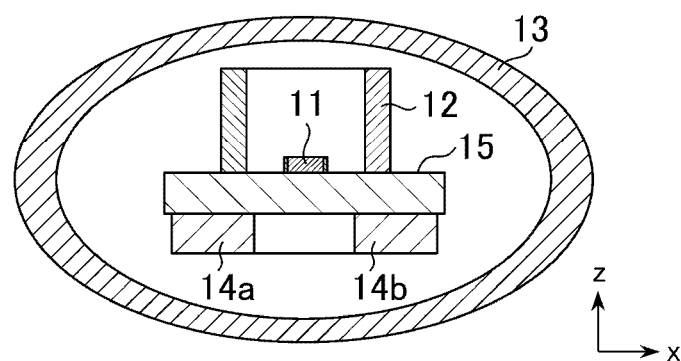
FIG. 26B illustrates an example in which the cross-sectional shape of the second magnetic body core is formed into a round (ellipsoidal) shape.
Figure 26C:
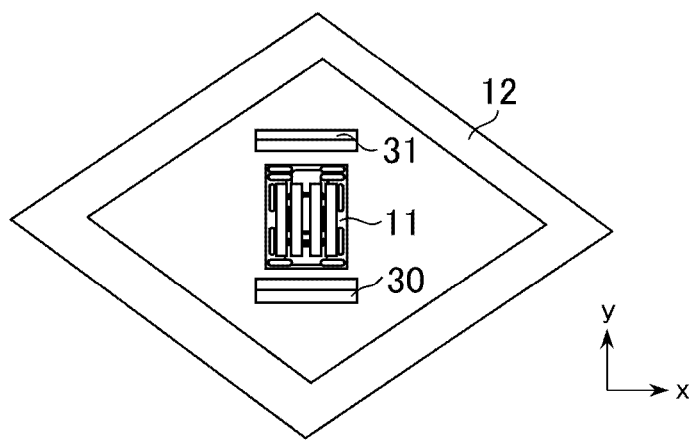
FIG. 26C illustrates an example in which the cross-sectional shape of the first magnetic body core 12 is formed into a diamond shape (example in which diagonal lines of the square are made parallel to x-direction and y-direction, respectively)

Further, cross-sectional shapes of the first and second magnetic body cores 12 and 13 are not limited to a square shape described in the sixth to tenth embodiments. FIG. 25A illustrates an example in which the cross-sectional shape of the first magnetic body core 12 is formed into a rounded corner square shape (example in which corners are each shaped into R- or C-shape). FIG. 25B illustrates an example in which the cross-sectional shape of the second magnetic body core 13 is formed into a rounded corner square shape (example in which corners are each shaped into R- or C-shape). FIG. 26A illustrates an example in which the cross-sectional shape of the first magnetic body core 12 is formed into a round (circular) shape. FIG. 26B illustrates an example in which the cross-sectional shape of the second magnetic body core 13 is formed into a round (ellipsoidal) shape. FIG. 26C illustrates an example in which the cross-sectional shape of the first magnetic body core 12 is formed into a diamond shape (example in which diagonal lines of the square are made parallel to x-direction and y-direction, respectively). When the cross-sectional shape having no corner as illustrated in FIGS. 25A, 25B and FIGS. 26A, 26B is adopted, the magnetic flux less leaks at the corner portions, thereby enhancing shielding effect of the external magnetic field. Further, when the diamond cross-sectional shape is adopted as illustrated in FIG. 26C, shielding effect equivalent to the example in which the four sides of a square are made parallel to x-direction and y-direction can be obtained.

When the magnetic body core illustrated in any one of FIGS. 25A, 25B, 26A, 26B, and 26C is adopted, the magnetic body core preferably has a plane-symmetrical shape with respect to y-z plane including line E (FIG. 10) or line F (FIG. 11B). Further, when a full-bridge circuit constituted by the four GMR elements is used as the magnetic field detection element 4, the magnetic body core is preferably disposed line-symmetrically with respect to line E as in the case of FIG. 10, whereby more stable output can be obtained.

Figure 27:
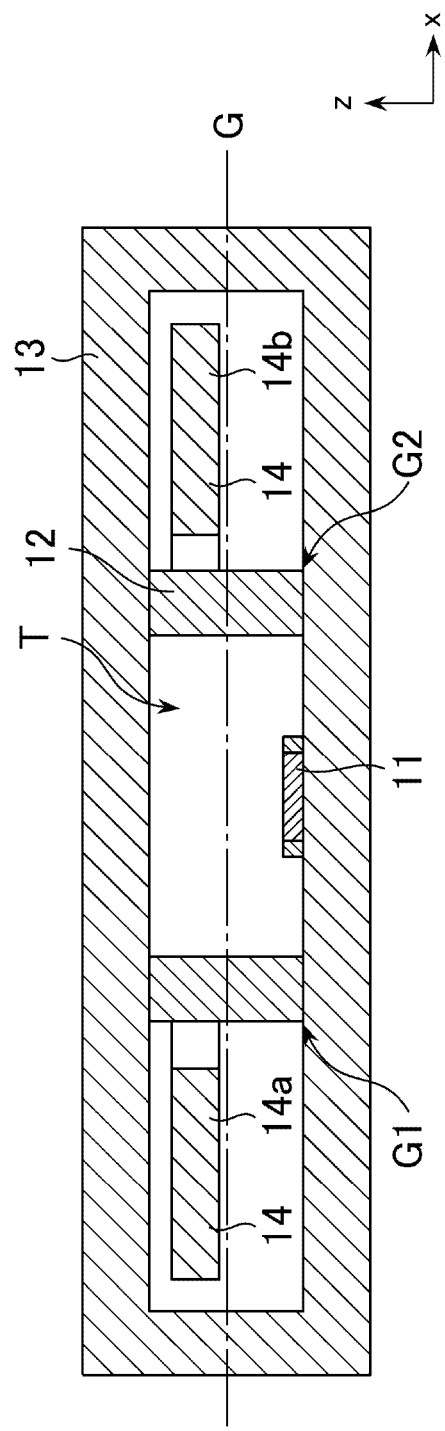
FIG. 27 illustrates an example in which a space in which the magnetic field detection element is disposed is completely surrounded by the first magnetic body core and the second magnetic body core.

Even if the size of the gap is set to zero, it is possible to increase the degree of freedom in selecting the type of the magnetic field detection element in some configurations. FIG. 27 is a cross-sectional view of a magnetic field detection device having such a configuration. In the illustrated example, in the magnetic field detection device illustrated in FIG. 11B, the sizes of the gap G1 and the gap G2 are set to zero, the substrate 15 is removed, and the conductor 14 (portions 14a and 14b) is moved to the lateral side of the first magnetic body core 12. The portions 14a and 14b are each disposed asymmetrically with respect to vertical direction center line G of FIG. 27 (more specifically, above the center line G).

The example of FIG. 27 is the same as the above embodiments in that the magnetic field detection element 11 is disposed outside both of the gap G1 and the gap G2, but differs from the same in that a space T in which the magnetic field detection element 11 is disposed is completely surrounded by the first magnetic body core 12 and the second magnetic body core 13. That is, although the magnetic field detection element 11 is completely magnetically shielded, the asymmetric arrangement of the portions 14a and 14b of the conductor 14 with respect to center line G allows a part of the magnetic field generated from the conductor 14 to appear in the space T. The magnetic field appearing in the space T leaks from the inner wall surface of the first magnetic body core 12. Thus, as in the fifth embodiment etc., the degree of freedom in selecting the type of the magnetic field detection element 11 has been increased. Further, such a configuration allows miniaturization of the magnetic field detection element 11.

Figure 28A:
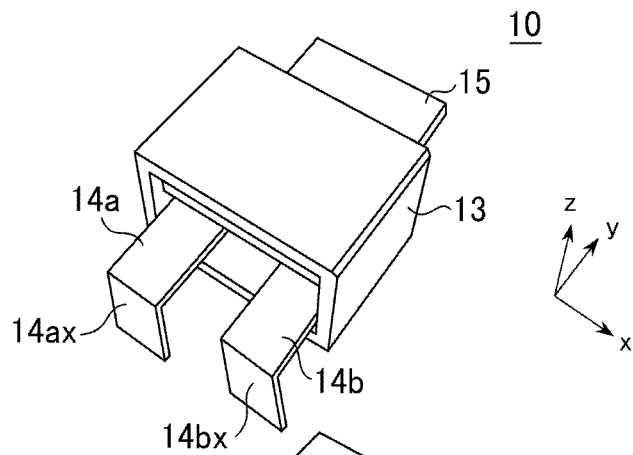
FIGS. 28A to 28C are views each illustrating an example in which leading ends of a bus bar are bent to one side in z-direction, FIGS. 28A to 28C corresponding to FIGS. 9A to 9C, respectively.
Figure 28B:
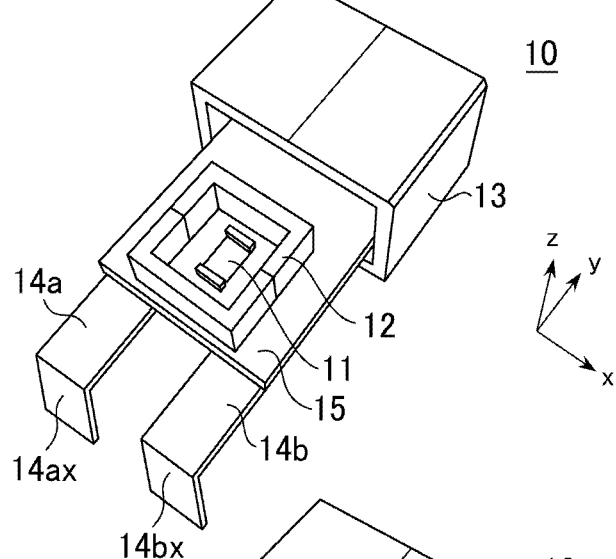
Figure 28C:
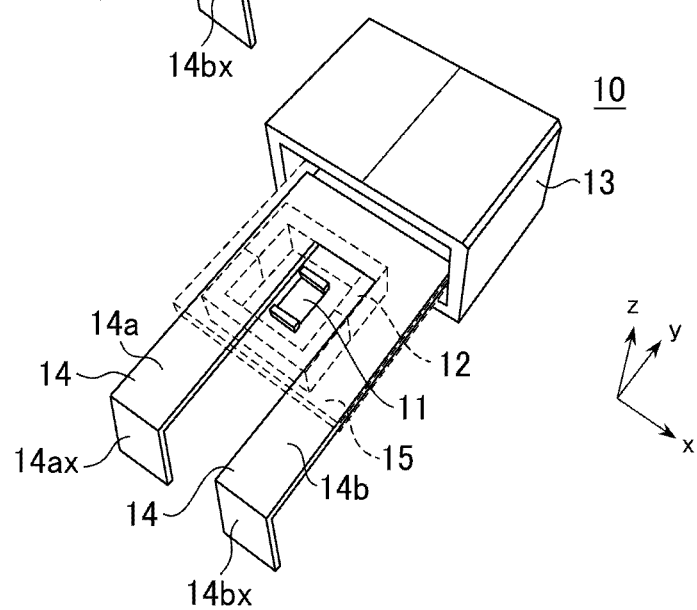
Figure 29A:
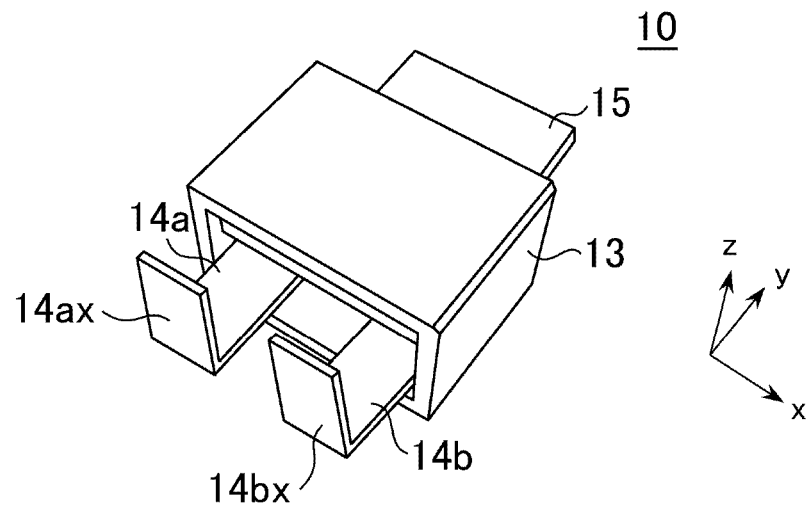
FIG. 29A illustrates an example in which the leading ends of the bus bar are bent to the other side in z-direction, FIG. 29A corresponding to FIG. 9A.
Figure 29B:
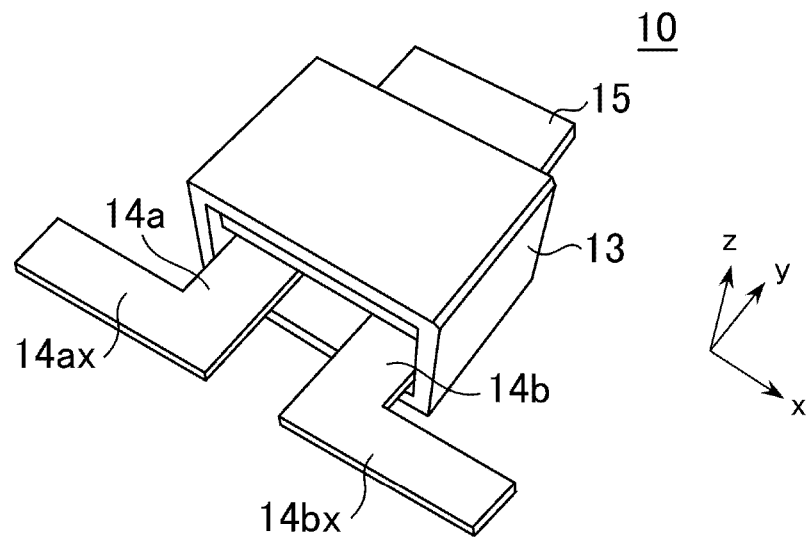
FIG. 29B illustrates an example in which the leading ends of the bus bar are bent to opposite sides in x-direction, FIG. 29B corresponding to FIG. 9A.
Figure 30:
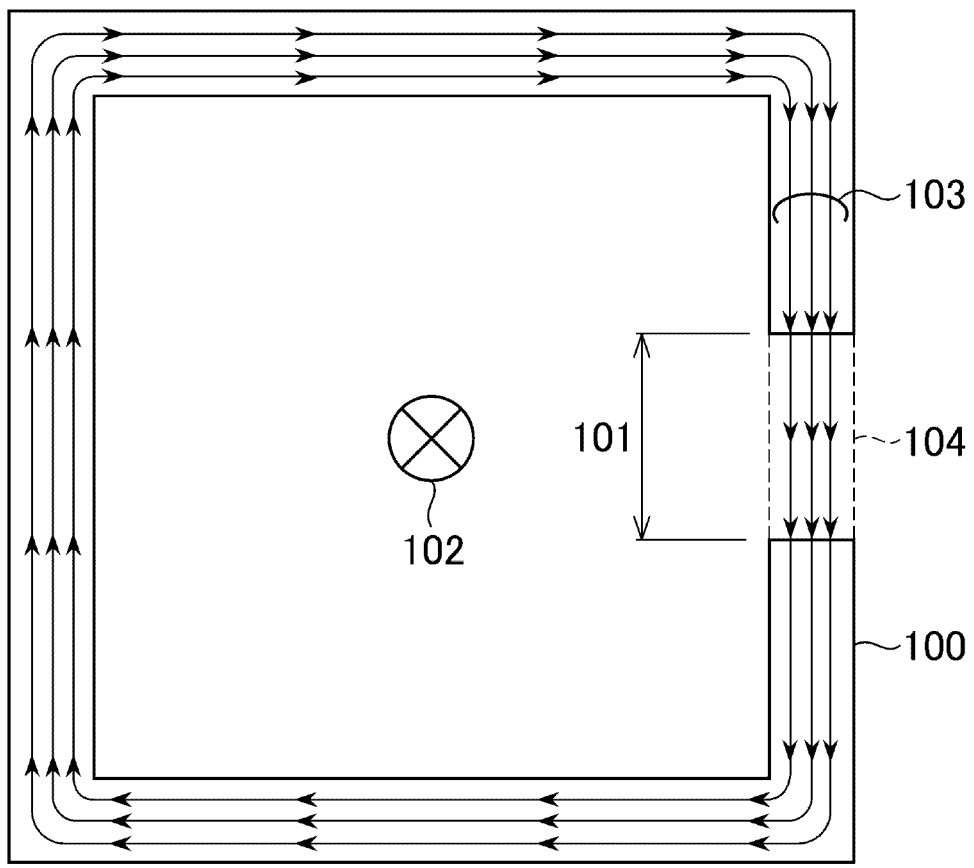
FIG. 30 is a schematic view illustrating an example of the C core according to a background art of the present invention.

Further, although the leading ends of the portions 14a and 14b of the bus bar 14 are extended straight in y-direction in the example of FIG. 9, the leading ends thereof may be bent in x- or z-direction according to the present invention. FIGS. 28A to 28C are views each illustrating an example in which leading ends 14ax and 14bx of the portions 14a and 14b of the bus bar 14 are bent to one side in z-direction. FIGS. 28A to 28C correspond to FIGS. 9A to 9C, respectively. Similarly, FIG. 29A illustrates an example in which the leading ends 14ax and 14bx are bent to the other side in z-direction, and FIG. 29B illustrates an example in which the leading ends 14ax and 14bx are bent to opposite sides in x-direction. FIGS. 28A and 28B correspond to FIG. 9A.

When the leading end of the bus bar 14 is bent, a magnetic field in a direction different from that of a magnetic field generated from the straight-extending portion is generated from the bent portion. This may cause a reduction in detection accuracy of the magnetic field detection element 11; however, a magnetic field generated from the bent portion can be shielded by the first and second magnetic body cores 12 and 13 in the present invention, so that the leading ends of the bus bar 14 can freely be bent without regard to the magnetic field generated from the bent portion.

REFERENCE SIGNS LIST 1, 10 magnetic field detection device
2, 5 C core
2a, 2b, 5a, 5b magnetic pole surface
2c, 2d, 5c, 5d end portion
2ca, 5ca outside side surface
2e, 5e extension portion
3, 6 conductor
4, 11 magnetic field detection element
12 first magnetic core
13 second magnetic body core
14, 14-1, 1-42 conductor (bus bar)
14a, 14b portion of the conductor 14
14-1a, 14-1b portion of the conductor 14-1
14-2a, 14-2b portion of the conductor 14-2
15 substrate
20 permalloy yoke
21 to 24 terminal electrode
25 planar spiral coil
30, 31 magnet
50 third magnetic body core
51a, 51b fourth magnetic body core
B1, B2 magnetic field
G1, G2 gap
R1 to R4 GMR element

What is claimed is:
1. A magnetic field detection device comprising:
a magnetic field detection element that detects a magnetic field;
a first magnetic body core extending in a first direction to surround the magnetic field detection element, the first magnetic body core having a first surface facing the magnetic field detection element, a second surface opposite to the first surface, a third surface between the first surface and the second surface, and a fourth surface opposite to the third surface;

a second magnetic body core extending in a second direction, perpendicular to the first direction, to surround the first magnetic body core, the second magnetic body core having a fifth surface facing the first magnetic body core, and a sixth surface opposite to the fifth surface; and a first magnetic field source provided between third surface of the first magnetic body core and a part of the fifth surface of the second magnetic body core, the part of the fifth surface of the second magnetic body core facing the third surface of the first magnetic body core, wherein the fourth surface of the first magnetic body core and another part of the fifth surface of the second magnetic body core magnetically contact each other, the another part of the fifth surface of the second magnetic body core facing the fourth surface of the first magnetic body core, and the third surface of the first magnetic body core and the part of the fifth surface of the second magnetic body core are isolated from each other.

2. The magnetic field detection device according to claim 1 further comprising a second magnetic field source provided between the third surface of the first magnetic body core and the part of the fifth surface of the second magnetic body core, wherein the first and second magnetic field sources both extend in a third direction different from the first and second directions, and the first and second magnetic field sources are disposed so that that the magnetic field detection element is located between the first magnetic field source and the second magnetic field source.

3. The magnetic field detection device according to claim 2, wherein the magnetic field detection element has a pair of magnetoresistive elements which are provided on opposite sides with respect to a center line of the first and second magnetic field sources, the center line being perpendicular to the third direction, and which have the same pinned layer magnetization direction.

4. The magnetic field detection device according to claim 3, wherein the pinned layer magnetization direction of the pair of magnetoresistive elements is different from an extending direction of the center line.

5. The magnetic field detection device according to claim 4, wherein the pinned layer magnetization direction of the pair of magnetoresistive elements is perpendicular to the center line.

6. The magnetic field detection device according to claim 3, wherein the pair of magnetoresistive elements have the same free layer magnetization direction, and the magnetic field detection device further comprises a third magnetic field source that generates a magnetic field parallel to the free layer magnetization direction.

7. The magnetic field detection device according to claim 2, wherein the first and second magnetic field sources are each a linear conductor that generates a magnetic field when a current flows therethrough, and an extending direction of each of the first and second magnetic field sources is perpendicular to the first plane.

8. The magnetic field detection device according to claim 7, wherein one end of the linear conductor serving as the first magnetic field source and one end of the linear conductor serving as the second magnetic field source are electrically connected to each other to form a first conductor.

9. The magnetic field detection device according to claim 8, further comprising a second conductor having first and second magnetic field sources, wherein the first and second conductors have the same shape as each other, and the second conductor is disposed on the first conductor.

10. The magnetic field detection device according to claim 9, wherein the first and second conductors are connected in parallel.

11. The magnetic field detection device according to claim 9, wherein the first and second conductors are connected in series.

12. The magnetic field detection device according to claim 1, wherein the first and second magnetic body cores each constitute a line-symmetrical closed curve.

13. The magnetic field detection device according to claim 12, wherein a normal vector of the closed curve constituted by the first magnetic body core and a normal vector of the closed curve constituted by the second magnetic body core are perpendicular to each other.

14. The magnetic field detection device according to claim 1, wherein the magnetic field detection element has a seventh surface facing the part of the fifth surface of the second magnetic body core, and an eighth surface facing the another part of the fifth surface of the second magnetic body core, and at least a part of the third surface of the first magnetic body core is positioned above the seventh surface of the magnetic field detection element.

15. The magnetic field detection device according to claim 1, wherein the magnetic field detection element has a seventh surface facing the part of the fifth surface of the second magnetic body core, and an eighth surface facing the another part of the fifth surface of the second magnetic body core, the magnetic field detection device further comprises a third magnetic body core which is disposed at a position overlapping the magnetic field detection element as viewed in the vertical direction, the position being between the seventh surface of the magnetic field detection element and the second magnetic body core, and the third magnetic body core magnetically contacts the second magnetic body core.

16. The magnetic field detection device according to claim 1 further comprising two fourth magnetic body cores which are disposed between the first and second magnetic field sources and a lower surface of the first magnetic body core, respectively, one end of each of the fourth magnetic body cores magnetically contacting the second magnetic body core.

17. A current sensor which is the magnetic field detection device as claimed in claim 1, the first magnetic field source being a conductor through which a current flows.

* * * * *